United States Patent
Akaogi et al.

[11] Patent Number: 5,835,416
[45] Date of Patent: Nov. 10, 1998

[54] FLASH-ERASABLE SEMICONDUCTOR MEMORY DEVICE HAVING AN IMPROVED RELIABILITY

[75] Inventors: Takao Akaogi, Kawasaki; Yasushige Ogawa, Kasugai; Tatsuya Kajita, Kawasaki; Hisayoshi Watanabe, Kawasaki; Minoru Yamashita, Kawasaki, all of Japan

[73] Assignees: Fujitsu Limited, Kawasaki; Fujitsu VLSI Limited, Kasugai, both of Japan

[21] Appl. No.: 986,338

[22] Filed: Dec. 5, 1997

Related U.S. Application Data

[62] Division of Ser. No. 978,976, Nov. 20, 1992.

[30] Foreign Application Priority Data

| Nov. 20, 1991 | [JP] | Japan | 3-304894 |
| Nov. 29, 1991 | [JP] | Japan | 3-316682 |
| Dec. 3, 1991 | [JP] | Japan | 3-319451 |
| Dec. 27, 1991 | [JP] | Japan | 3-347343 |
| Jan. 13, 1992 | [JP] | Japan | 4-4216 |
| Mar. 18, 1992 | [JP] | Japan | 4-61730 |
| Aug. 6, 1992 | [JP] | Japan | 4-210380 |
| Sep. 18, 1992 | [JP] | Japan | 4-249958 |
| Nov. 19, 1992 | [JP] | Japan | 4-310472 |

[51] Int. Cl.$^6$ .................... G11C 16/00
[52] U.S. Cl. .................. 365/185.19; 365/185.13; 365/365.28; 365/185.33
[58] Field of Search ......... 365/185.19, 185.24, 365/185.18, 185.28, 185.33

[56] References Cited

U.S. PATENT DOCUMENTS

| 4,250,569 | 2/1981 | Sasaki et al. | 365/185 |
| 4,344,154 | 8/1982 | Klaas et al. | 365/194 |
| 4,503,524 | 3/1985 | McElroy | 365/218 |
| 4,720,816 | 1/1988 | Matsuoka et al. | 365/185.23 |

(List continued on next page.)

FOREIGN PATENT DOCUMENTS

| 0 143 596 | 6/1986 | European Pat. Off. . |
| 0 392 895A2 | 10/1990 | European Pat. Off. . |
| 55-19867 | 2/1980 | Japan . |
| 57-87620 | 6/1982 | Japan . |
| 60-113397 | 6/1985 | Japan . |
| 63-31219 | 2/1988 | Japan . |
| 1-282796 | 11/1989 | Japan . |
| 3-207097 | 9/1991 | Japan . |
| 3-241592 | 10/1991 | Japan . |
| 3-245566 | 11/1991 | Japan . |
| 3-258015 | 11/1991 | Japan . |

OTHER PUBLICATIONS

IEEE Journal of Solid–State Circuits, vol. 24, No. 5, Oct. 1989, New York, U.S., pp. 1244–1249.

IEEE Journal of Solid–State Circuits, vol. 23, No. 1, Feb. 1988, New York, U.S., pp. 79–85.

Patent Abstract of Japan of Japanese Patent Appln. 3–181097, "Non–Volatile Memory Device", dated Aug. 7, 1991.

*Primary Examiner*—Tan T. Nguyen
*Attorney, Agent, or Firm*—Nikaido, Marmelstein, Murray & Oram LLP

[57] ABSTRACT

A flash-erasable semiconductor memory device comprises a memory cell array including a plurality of memory cell transistors each having an insulated floating gate for storing information and a control electrode provided on said floating gate, wherein the flash-erasable semiconductor memory device includes a write control circuit supplied with a write control signal, when writing information. The write control circuit produces a control signal such that a leading edge of the drain control signal appears after a leading edge of the gate control signal. Further, the gate control circuit shuts off the gate control signal such that a trailing edge of the gate control signal appears after a trailing edge of the drain control signal.

3 Claims, 35 Drawing Sheets

U.S. PATENT DOCUMENTS

| | | | |
|---|---|---|---|
| 4,769,787 | 9/1988 | Furusawa et al. | 365/184 |
| 5,077,691 | 12/1991 | Haddad et al. | 365/185 |
| 5,089,867 | 2/1992 | Lee | 365/185.01 |
| 5,122,985 | 6/1992 | Santin | 365/185.18 X |
| 5,140,182 | 8/1992 | Ichimura | 365/185.18 X |
| 5,235,544 | 8/1993 | Caywood | 365/900 |
| 5,257,225 | 10/1993 | Lee | 365/185.19 |
| 5,267,196 | 11/1993 | Talreja et al. | 365/230.03 |
| 5,283,758 | 2/1994 | Nakayama et al. | 365/185.18 X |
| 5,307,316 | 4/1994 | Takemae | 365/200 |
| 5,487,033 | 1/1996 | Keenes et al. | 365/185.19 |

| MODE | $V_g$ | $V_D$ | $V_S$ | $V_{SUB}$ |
|---|---|---|---|---|
| WRITE | ($V_H$) | ($V_M$) | 0V | 0V |
| READ | ($V_L$) | 1V | 0V | 0V |
| ERASE | 0V | OPEN | ($V_H$) | 0V |

FIG. 7
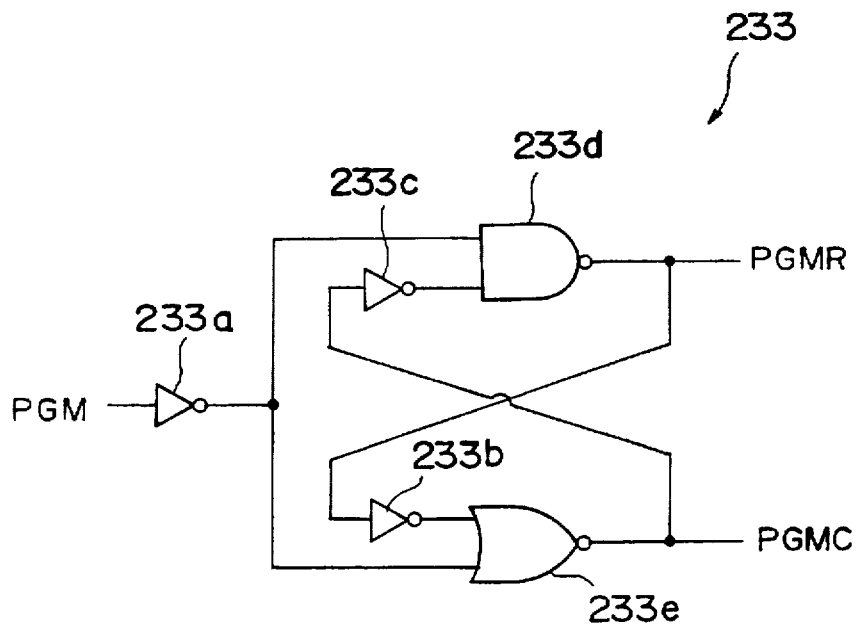
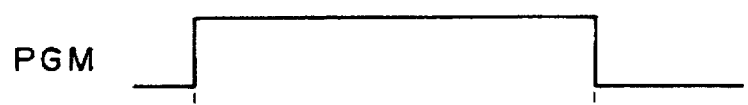
FIG.8 (A) PGM
FIG.8 (B) PGMR
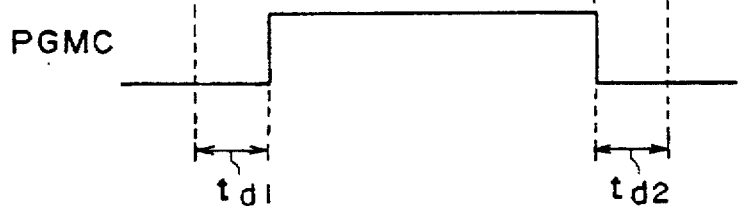
FIG.8 (C) PGMC

| MODE | $V_g$ | $V_D$ | $V_S$ | $V_{SUD}$ |
|---|---|---|---|---|
| ERASE | $(-V_E)$ | OPEN | OPEN | $(V_L)$ |

| MODE | $V_g$ | $V_D$ | $V_S$ | $V_{SUB}$ |
|---|---|---|---|---|
| ERASE | $(-V_E)$ | OPEN | $(V_L)$ | OPEN |

F I G. 16
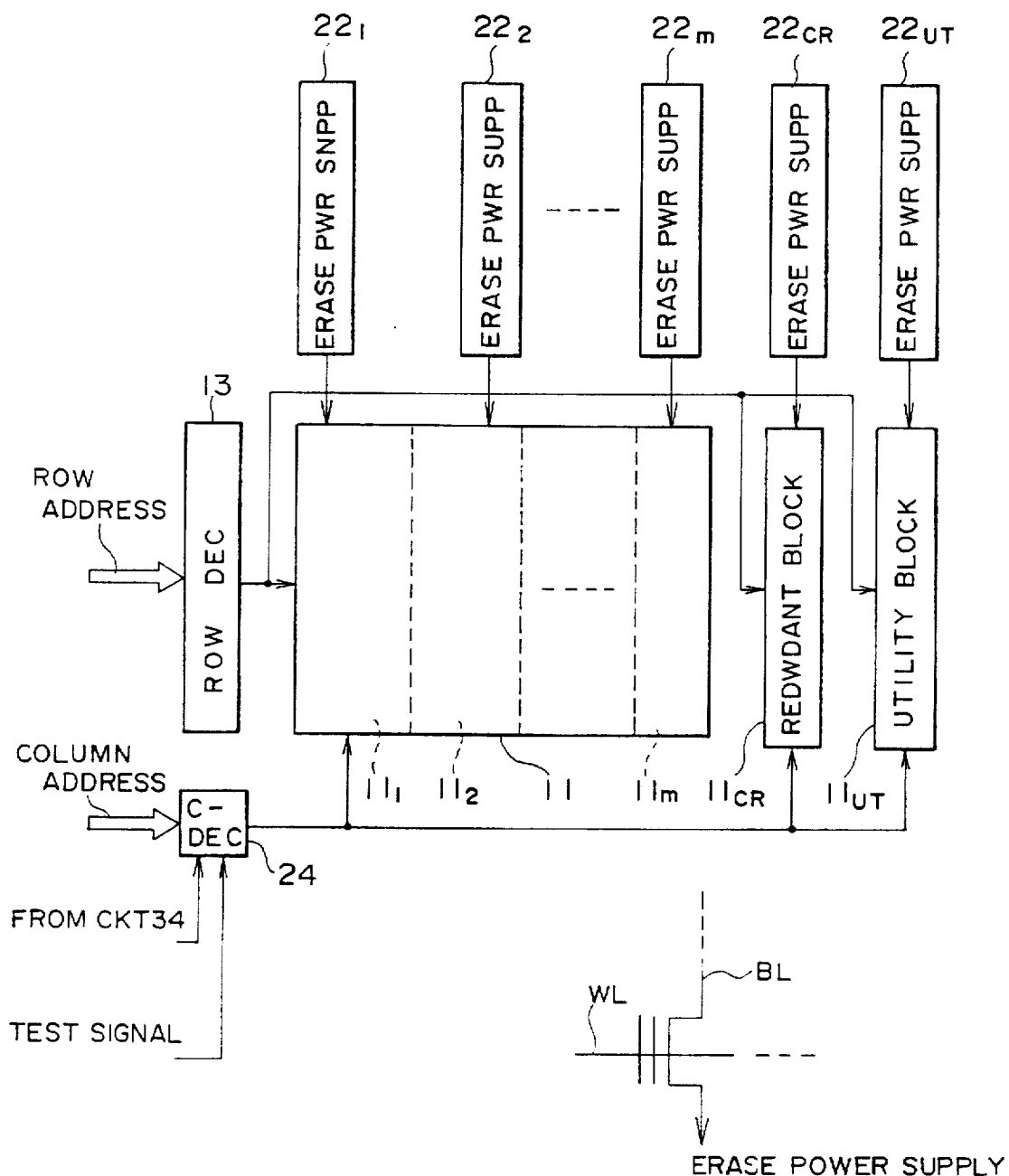

F I G. 18
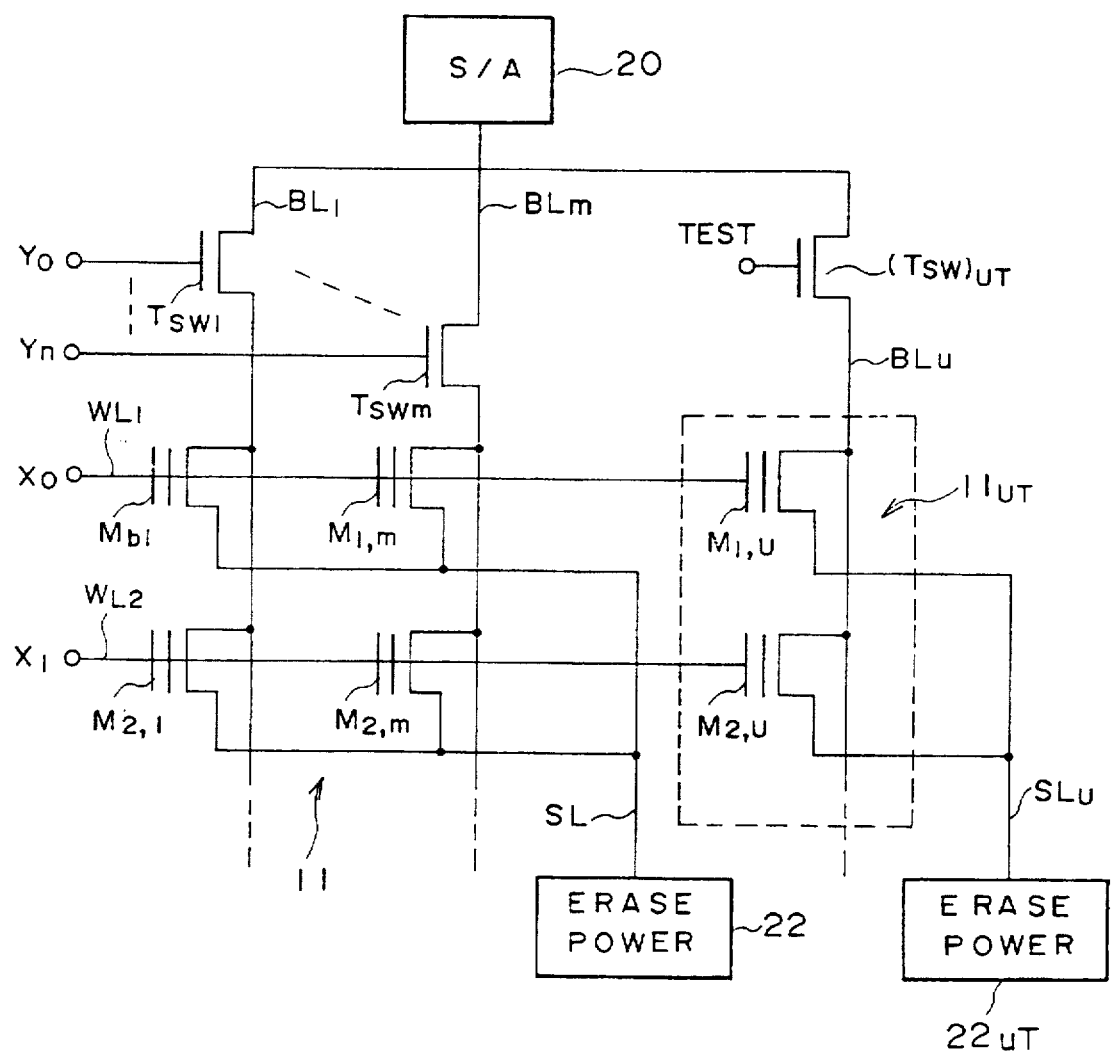

F I G. 19
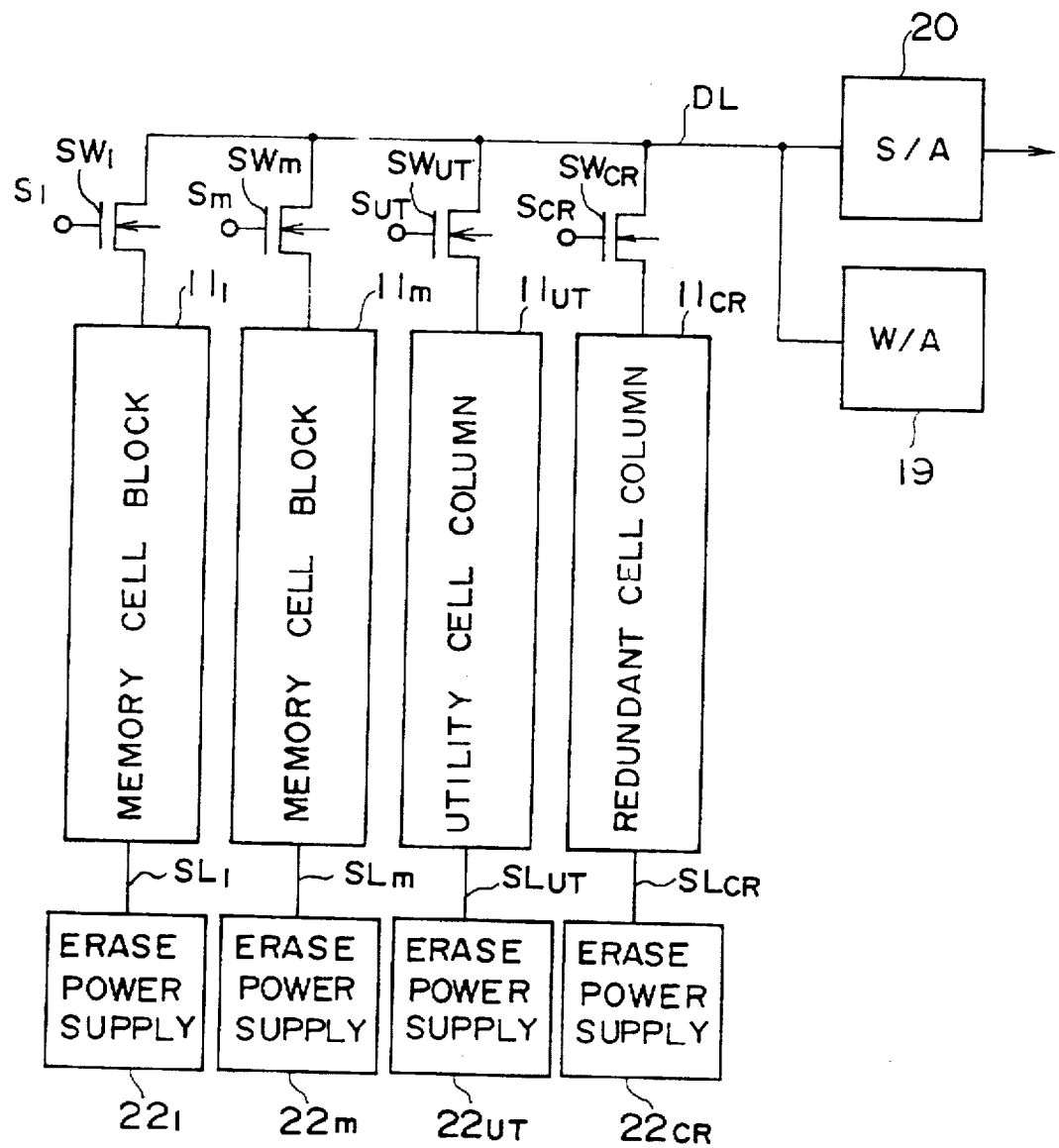

F I G. 32
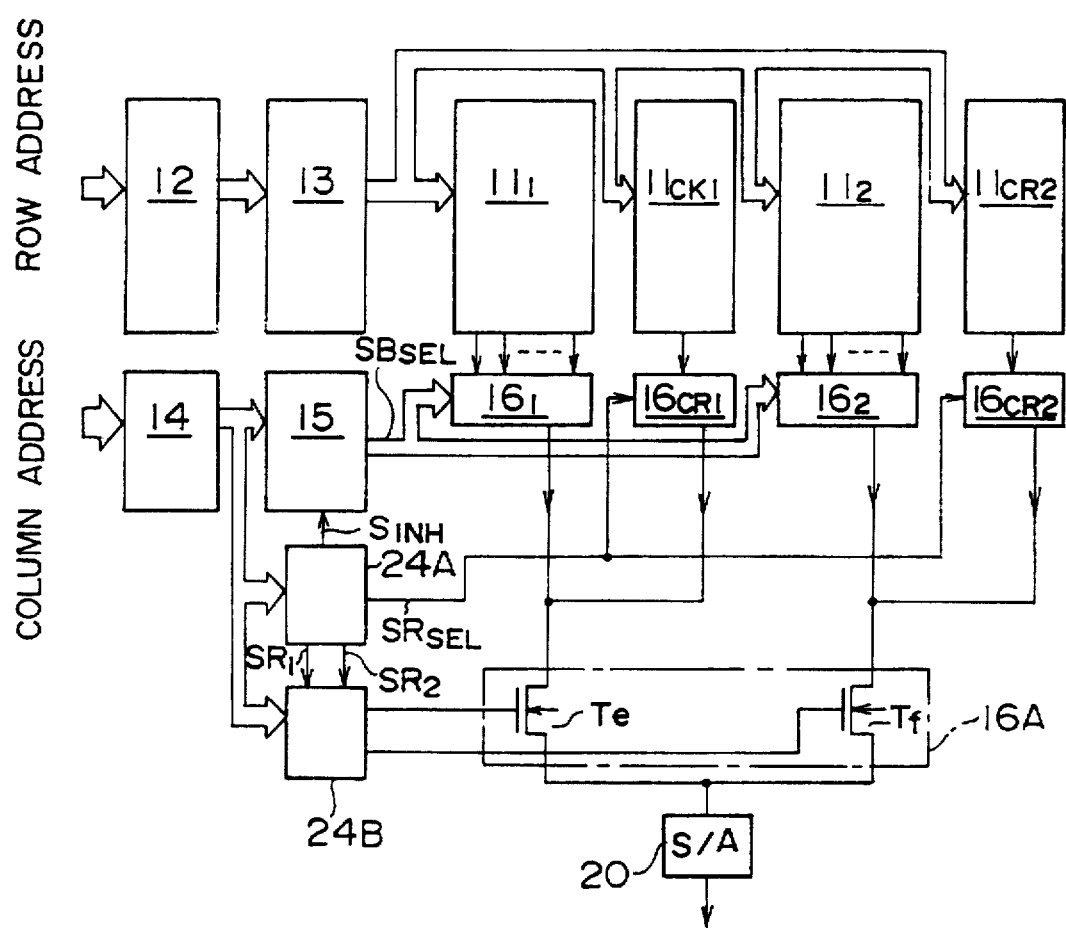

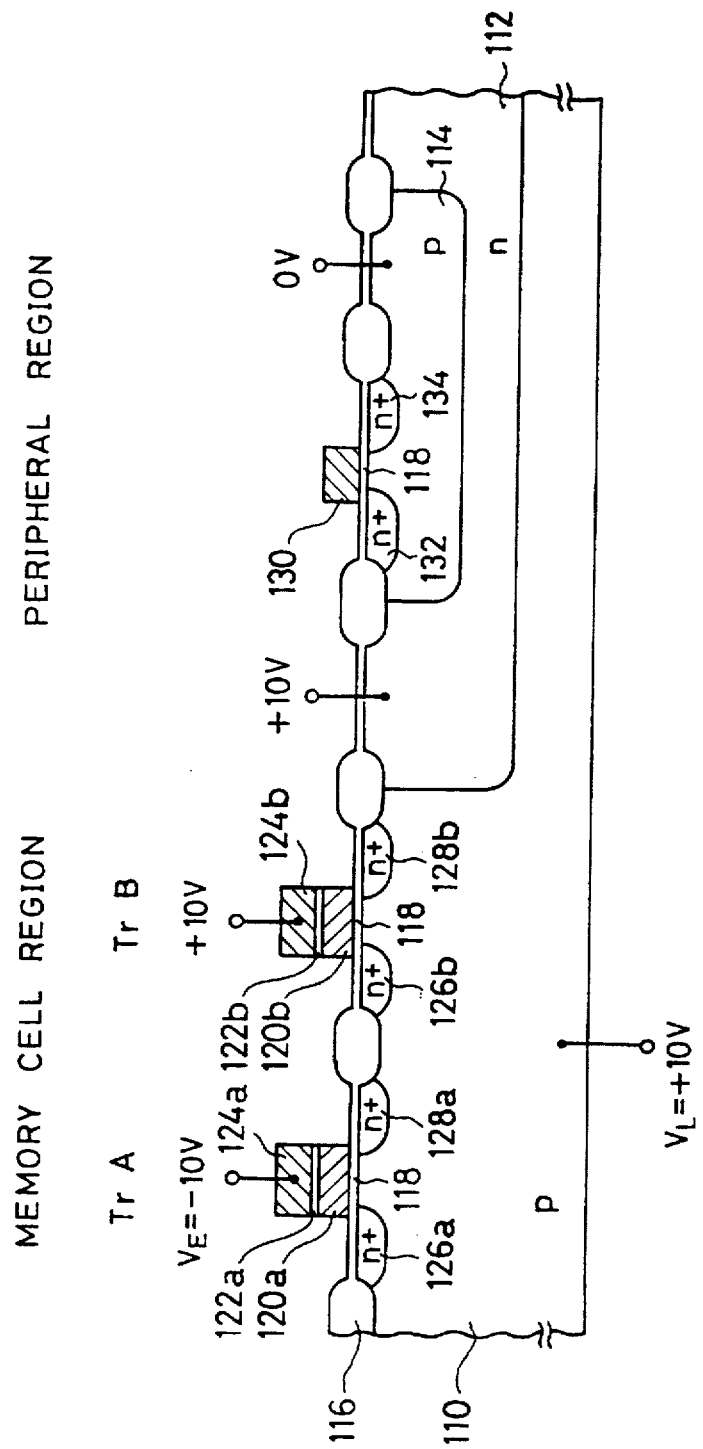

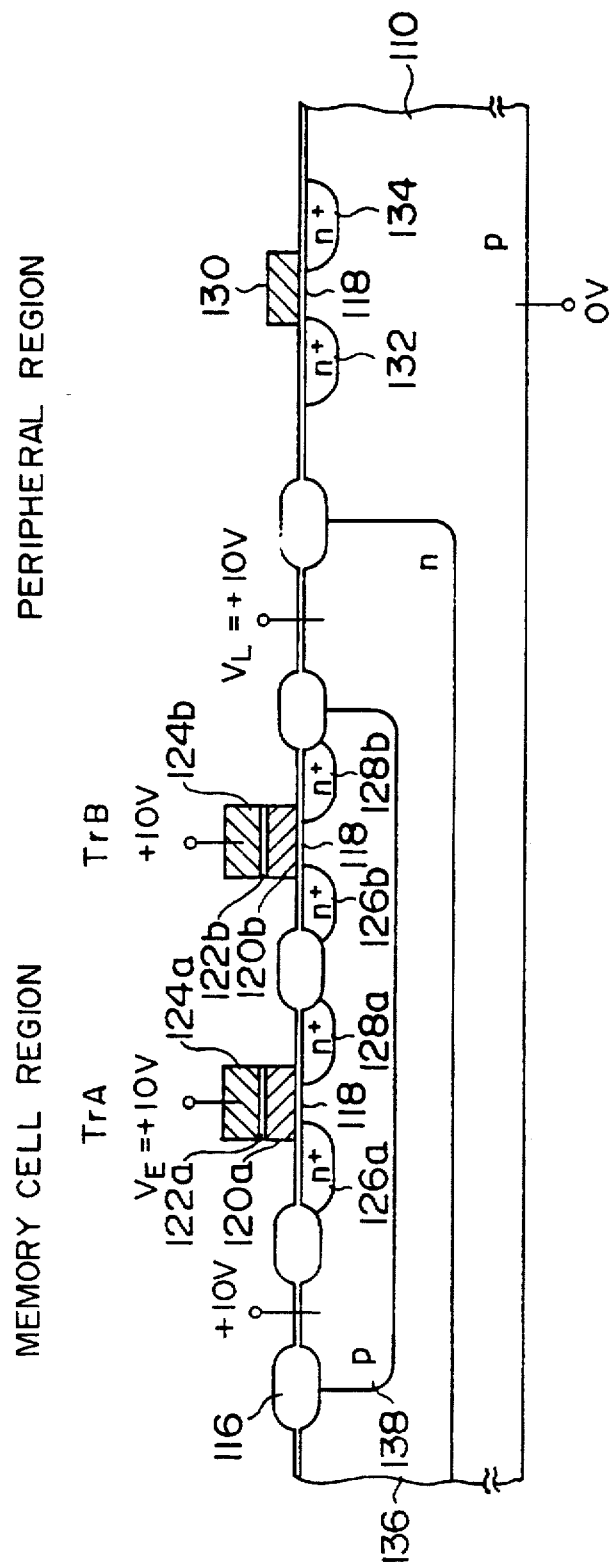

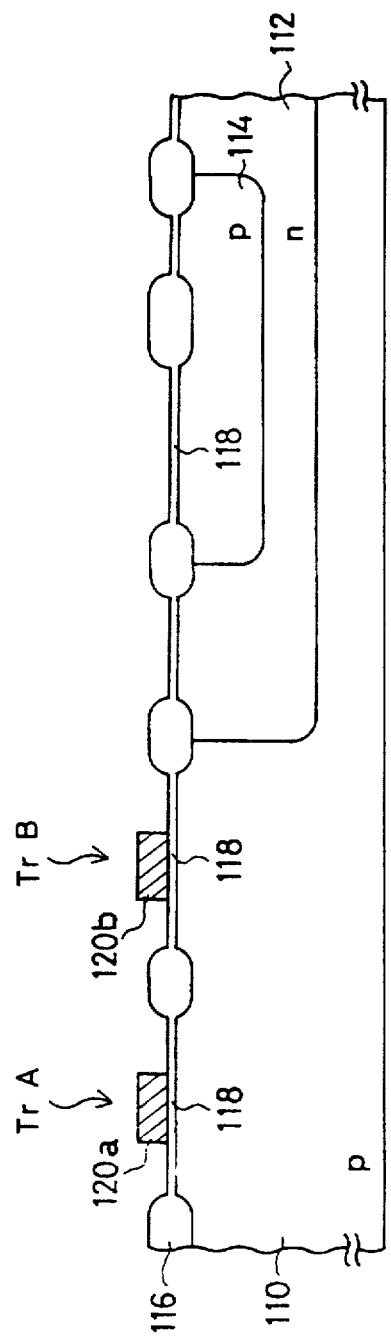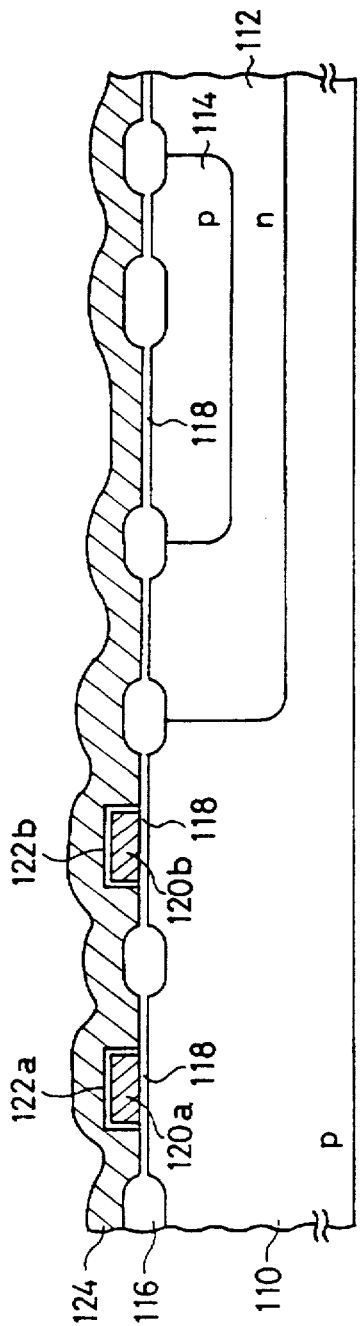

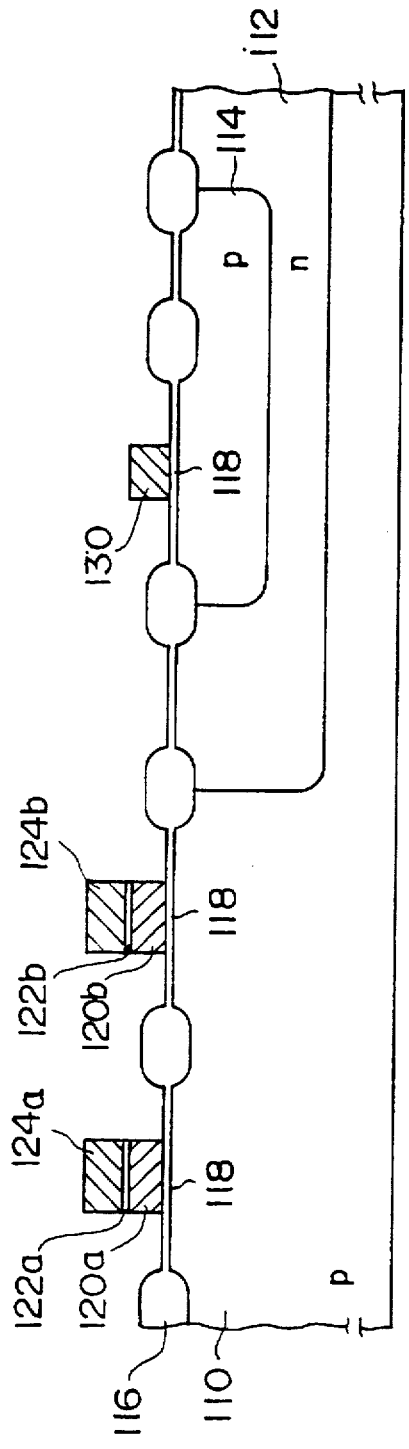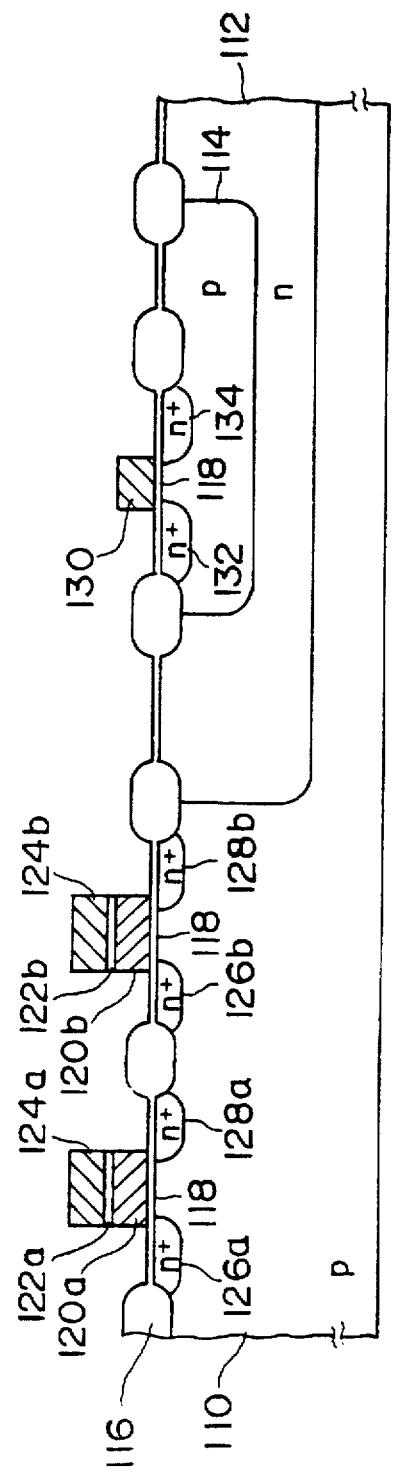

FLASH-ERASABLE SEMICONDUCTOR MEMORY DEVICE HAVING AN IMPROVED RELIABILITY

This application is filed as a divisional application under Rule 53(b) of parent application Ser. No. 07/987,976, filed Nov. 20, 1992.

BACKGROUND OF THE INVENTION

The present invention generally relates to semiconductor devices and more particularly to a flash-erasable EPROM device or simply a flash memory device that has an improved reliability.

In relation to the storage device of computers, there is a continuous demand for a non-volatile semiconductor memory device having a large capacity for storing information. Particularly, the so-called flash-erasable memory device or simply flash memory device has been studied intensively in recent years as an alternative of hard disk devices. In flash memory devices, rewriting of data is possible similarly to the conventional random access memories, while the device can hold the written information even when the electrical power is turned off. Thus, the device is ideal for external storage device of computers such as a hard disk. Further, application to the memory cards is studied. In relation to various applications of the flash memory device, intensive efforts are in progress to improve the reliability of the device.

FIG. 1 shows the structure of a typical memory cell transistor that forms a flash memory device.

Referring to FIG. 1, the memory cell transistor is constructed on a semiconductor substrate 1 and includes a source region 6 and a drain region 7 formed in the substrate 1 similarly to a conventional MOS transistor. On the upper major surface of the substrate 1, a gate insulation film 2 is provided to cover the channel region extending between the source region 6 and the drain region 7, and a gate electrode 3 is formed on the gate insulation film 2 in correspondence to the channel region of the device. Further, a capacitor insulation film 4 is provided to surround the gate electrode 3, and the gate electrode 3 thereby forms a floating gate electrode. Further, an electrode 5 is provided on the floating gate electrode 3 such that the electrode 5 is insulated from the electrode 3 by the capacitor insulation film 4. Thereby, the electrode 5 is used as a control electrode.

Hereinafter, the operation of a flash memory of the NOR type will be described.

When writing data, a predetermined drive voltage is applied across the source region 6 and the drain region 7 such that the electrons are caused to flow from the source region 6 to the drain region 7. Simultaneously, a large positive voltage is applied to the control electrode 5 to induce a large electric field between the floating gate electrode 3 and the substrate 1. Thereby, the electrons transported along the channel region and accelerated in the vicinity of the drain region 7 are injected into the floating gate electrode 3 through the gate insulation film 2 as hot electrons. Once the electrons are injected, the electric charges associated with the electrons controls the conduction of the channel region between the source and drain regions 6 and 7. In other words, one can read the content of the data written into the memory cell transistor by detecting the conduction thereof. When erasing data, on the other hand, a large electric field is induced between the floating gate 3 and the source region 6 by applying a large positive voltage to the source region 6. Thereby, the electrons in the floating gate 3 dissipate into the source region 6 by causing a tunneling through the gate insulation film 2.

FIG. 2 shows the foregoing control scheme of the flash memory device for the writing mode for wiring data into the memory cell, the reading mode for reading data from the memory cell, and the erasing mode for erasing data from the memory cell, wherein the voltage $V_H$ is set typically to +12 volts, while the voltage $V_M$ may be set to +6 volts. Further, the voltage $V_L$ is set to about +5 volts.

FIG. 3 shows the overall construction of a typical flash memory device.

Referring to FIG. 3, the device includes a memory cell array 11 in which a plurality of memory cell transistors each having a construction of FIG. 1 are arranged in rows and columns, and the memory cell in the memory cell array 11 is selected in response to address data that is supplied to a row address buffer circuit 12 for activating a row decoder 13 and a column address buffer circuit 14 for activating a column decoder 15. There, the row decoder 13 selects a word line WL in response to the row address data latched in the row address buffer circuit 12 while the column decoder 15 controls a column selection gate 16 to select a bit line BL in response to the column address data that is latched in the column address buffer circuit 14.

In order to achieve inputting and outputting of data, there is provided a data bus 17 connected to an input/output buffer circuit 18, and the data on the bus 17 is written into a selected memory cell such as the memory cell 11a via a write amplifier 19 and the column selection gate 16. On the other hand, the data stored in the selected memory cell is transferred to the input/output buffer circuit 18 via the column selection gate 16 and a sense amplifier 20. Further, in order to control the read/write operation of the memory device, there is provided another buffer circuit 21 that is supplied with an output enable signal /OE, a chip enable signal /CE, and further with a write enable signal /WE, wherein the signal /OE is used for enabling the data output of the input/output buffer circuit 18, the signal /CE is used for the chip selection, and the signal /WE is used for enabling the writing of data into the selected memory cell.

Further, there is provided an erase power supply unit 22 that characterizes the NOR type flash memory device, wherein the power supply unit 22 supplies a predetermined erase voltage when erasing the data from the memory cell array. As is well known, the erasing of data occurs simultaneously for all the memory cells in the memory cell array 11 in the flash memory device. In addition, in order to control the operation of memory cell device including the erase power supply 22, a controller 23 is provided. There, the controller 23 is supplied with data from the data bus 17 as well as an output of the buffer circuit 21 and controls the read/write as well as erase operation of the device.

FIG. 4 shows the writing of data into the memory cell transistor of FIG. 1, wherein the vertical axis represents the drain current and the horizontal axis represents the drain voltage. As already noted with reference to FIG. 2, the voltage $V_D$ is applied to the drain region during the writing process of data, while the voltage $V_H$ is applied simultaneously to the control gate.

Referring to FIG. 4, it will be noted that the drain current increases in an interval designated as "1" with increasing drain voltage $V_D$, while the drain current decreases suddenly in correspondence to the interval designated as "2" with further increase in the drain voltage $V_D$. In correspondence to this negative bump of the drain current, the injection of electrons into the floating gate electrode occurs. Further, when the drain voltage $V_D$ has reached an avalanche voltage $V_{ABD}$, an avalanche breakdown occurs in the channel region of the memory cell transistor and the drain current increases steeply. Thereby, an efficient injection of the electrons is achieved into the floating gate. Thus, the flash memory device generally uses the avalanche voltage $V_{ABD}$ for the voltage $V_M$ shown in FIG. 2 to achieve an efficient writing of the data. In fact, the drain voltage $V_D$ is clamped at the level $V_{ABD}$ when the foregoing positive control voltage $V_H$ is applied to the control gate.

On the other hand, when the voltage of the control gate is low or zero in correspondence to an operational state of the device wherein no writing of data occurs, the drain current changes as shown in the broken line in FIG. 4. There, the drain current remains low until a breakdown voltage $V_{JCT}$ is reached. In response to the voltage $V_{JCT}$, a breakdown occurs at the p-n junction between the drain region and the substrate. Generally, the voltage $V_{JCT}$ is larger than $V_{ABD}$ by more than one volt. Thereby, there can occur a possibility that the writing of data into a first memory cell transistor can affect the operation of a second memory transistor that shares the power supply line commonly with the memory cell transistor. It should be noted that the large drain voltage applied to the first memory cell transistor for writing data induces a large electric field between the drain region and the floating gate in the second memory cell transistor. Thereby, the electric charges stored in the second memory cell transistor can dissipate into the drain of the same memory cell transistor and the data held therein is destroyed. This interference of memory cell transistors is known as "disturbance."

Further, the conventional flash memory device has suffered from the problem of limited flexibility in the design of redundant construction in that only the column redundancy is possible as shown in FIG. 5.

Referring to FIG. 5, the drawing corresponds to FIG. 3 and includes the memory cell array 11 that in turn includes a number of memory cells $M_{1,1}$–$M_{2,3}$ provided in correspondence to intersections of word lines $WL_1$–$WL_2$ and bit lines $BL_1$–$BL_3$. In FIG. 5, those parts corresponding to the parts described previously are designated by the same reference numerals and the description will be omitted. It will be noted that the column selection gate 16 includes transfer gate transistors $Tsw_1$–$Tsw_3$ for selecting the bit lines $BL_1$–$BL_3$ respectively.

In the memory cell array 11 of FIG. 5, it will be noted that there is provided another transfer gate transistor $Tsw_4$ that is activated in response to an output of a decoder 24 for selecting another bit line $BL_4$, and a column redundant memory cell array $11_{CR}$ is provided in connection to the bit line $BL_4$. There, the redundant memory cell array $11_{CR}$ includes memory cell transistors $M_{1,4}$ and $M_{2,4}$ having respective drains connected commonly to the bit line $BL_4$ and the memory cell array $11_{CR}$ is activated in response to the output of the redundant decoder 24 that in turn is controlled by a defect detection circuit 25. There, the circuit 25 is supplied with the column address data from a column buffer circuit 14 and compares the same with the address data for defective memory cells stored in a memory device not illustrated. When the address data indicates the selection of a defective memory cell, the circuit 25 activates the redundant decoder 24 that in turn selects the redundant bit line $BL_4$. It should be noted that such a redundant memory cell array may be provided as a part of a utility memory cell array that is provided separately from the real memory cell array for various purposes such as testing. In other words, one can use such a memory cell array $11_{CR}$ also for testing as will be discussed later with reference to the embodiment of the present invention.

In such a conventional flash memory device, it is desirable to provide a row redundant memory cell array in addition to the column redundant memory cell array $11_{CR}$ for increasing the degree of freedom for saving the defect in the memory cells. However, such a construction of row redundant memory cell array has been generally impossible in the flash memory devices. Hereinafter, the reason of this undesirable situation will be examined briefly.

In the flash memory devices, the electric charges are removed from the floating gate each time the data stored in the memory cell is erased. As already noted, such an erasing process is conducted by applying a positive voltage to the source region. Thereby, all the memory cells that are connected commonly to the source supply voltage experience dissipation of the electric charges from the floating gate. In other words, the data stored in the memory cells that form the memory cell array of the device are erased simultaneously.

Another point that requires special attention in the flash memory devices is that the dissipation of electrons from the floating gate should be achieved in such a manner that no substantial electric charges remain in the floating gate after the erasing of data has occurred in the memory cell. When the removal of electrons is excessive, the floating gate may charge positively and the memory cell transistor is turned on permanently. In order to avoid this problem of "excessive erasing," it is generally practiced to write data "0" into the memory cell by injecting electrons to the floating gate before each erasing process of data.

Thus, when a row redundant memory cell array is constructed by modifying the circuit of FIG. 5, for example such that the word line $WL_2$ is selected in place of the word line $WL_1$ for saving defective memory cells connected to the word line $WL_1$, the writing of the data "0" does not occur to the memory cells connected to the word line $WL_1$. On the other hand, the removal of the electric charges occurs also in these memory cells in response to the erasing process, as these memory cells are connected also to the erase power supply unit 22. Thereby, the memory cell transistors $M_{1,1}$–$M_{1,4}$ connected to the word line $WL_1$ are inevitably erased excessively as a result of the excessive removal of the electrons to the drain region. When this occurs, the floating gate is injected with holes and the memory cell transistors take a permanently turned-on state. As the transistors $M_{1,1}$–$M_{1,4}$ are connected to the bit lines $BL_1$–$BL_4$, such an erroneous turning-on of the memory cell transistors inevitably causes a erroneous voltage level of the bit lines and the overall operation of the flash memory device becomes defective.

In the conventional flash memory devices having the column redundancy as shown in FIG. 5, it is proposed to divide the memory cell array into a plurality of blocks each driven by an independent power supply unit such that the simultaneous erasing of data occurs only in each block instead of the entirety of the memory cell array. When the column redundancy is applied to such a device, however, the redundant memory cell columns are provided in each block and there arises an inconvenience in that a substantial device area is occupied by the redundant memory cell columns. Thereby, there is a demand to reduce the area of the device that is occupied by the redundant memory cell column.

In the conventional memory devices such as dynamic random access memories or static random access memories, it has been practiced to provide a utility memory cell block for testing the device. Such a utility block is used for example for the purpose of guaranteeing a predetermined number of times for the rewriting of data into the memory cell transistors forming the memory cell array. In the flash memory devices, however, erasing of data is achieved in the ordinary, "real" memory cell block each time the data is erased from the utility memory cell block, as long as the memory cell transistors in the real memory cell block share the electric power supply with the memory cell transistors in the utility memory cell block. Thereby, the memory cell transistors in the real memory cell block are erased excessively and the proper read/write operation of the device is no longer possible. In other words, the conventional flash memory devices have suffered from the problem that the test for guaranteeing the number of times the write operation can be achieved properly is impossible.

In addition, in the conventional flash memory devices, there has been a problem in that one has to design the device to have a relatively large channel length in correspondence to the relatively large voltage applied to the source region for erasing data from the memory cell transistors, such that a sufficient junction breakdown voltage is secured. On the other hand, such a large channel length inevitably imposes a problem in the miniaturization of the device. Thus, it is desired to reduce the magnitude of the voltage that is applied to the memory cell transistor for erasing information therefrom.

SUMMARY OF THE INVENTION

Accordingly, it is a general object of the present invention to provide a novel and useful flash memory device, wherein the foregoing problems are eliminated.

Another and more specific object of the present invention is to provide a flash memory device, wherein a reliable read/write operation is guaranteed by controlling the magnitude of the voltage applied to the control electrode such that the control voltage is clamped at the avalanche voltage. Thereby, the problem of excessive rising of the control voltage and hence the problem of the interference between adjacent memory cell transistors is avoided.

Another object of the present invention is to provide a flash memory device that includes a row-redundant construction. As a result of the row-redundancy, the degree of freedom for realizing the redundancy is substantially increased.

Another object of the present invention is to provide a flash memory device having a column redundant construction, wherein the power supply for supplying electrical power to the real memory cell block and to the redundant memory cell block is improved.

Another object of the present invention is to provide a flash memory device having a utility memory cell block in addition to a real memory cell block, wherein the problem of excessive erasing in the real memory cell block during the operational interval of the utility memory cell block is successfully eliminated.

Another object of the present invention is to provide a flash memory device having a column redundancy, wherein the device has a simplified construction for selecting the redundant memory cell block in correspondence to the selection of a defective memory cell column.

Another object of the present invention is to provide a flash memory device wherein the supply voltage used for erasing data is reduced.

Other objects and further features of the present invention will become apparent from the following detailed description when read in conjunction with the attached drawings.

BRIEF DESCRIPTION OF THE DRAWINGS

FIG. 7 is a diagram showing the circuit diagram of a control circuit used in the flash memory of FIG. 6;

FIGS. 8(A)–8(C) are diagrams showing the timing for biasing the flash memory of FIG. 6;

FIG. 16 is a block diagram showing the flash memory having a column redundancy according to a third embodiment of the present invention;

FIG. 18 is a circuit diagram showing a modification of the memory device of FIG. 16;

FIG. 19 is a circuit diagram showing a fourth embodiment of the memory device of FIG. 16;

FIG. 32 is a block diagram showing a modification of the flash memory of FIG. 29;

FIG. 34 is a diagram showing the structure of a flash memory according to an eighth embodiment of the present invention;

FIG. 35 is a diagram showing a modification of the flash memory of FIG. 34;

FIGS. 36(A)–36(F) are diagrams showing the fabrication process of the device of FIG. 34.

DETAILED DESCRIPTION OF THE PREFERRED EMBODIMENTS

Figure 6:
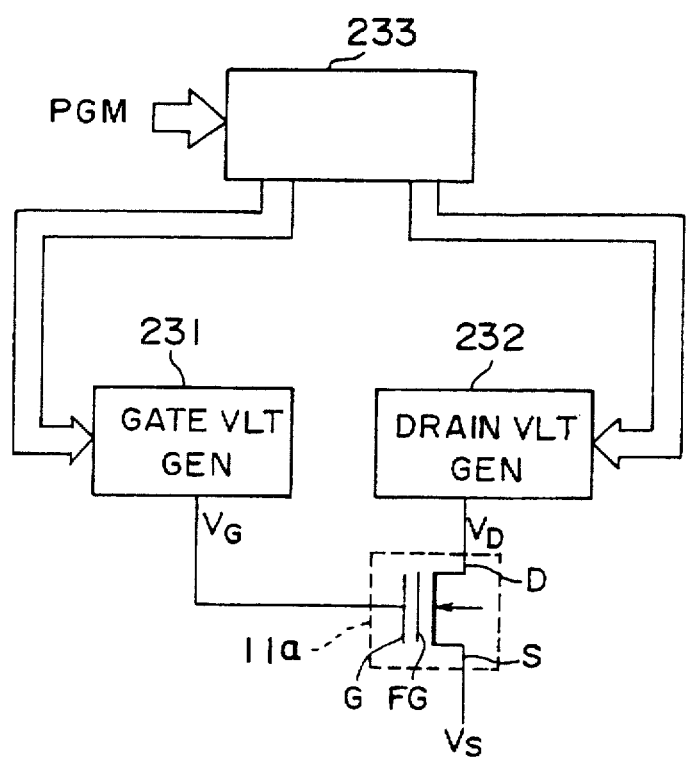
FIG. 6 is a diagram showing the principle of a first embodiment of the present invention.

FIG. 6 shows the principle of the first embodiment of the present invention.

Figure 3:
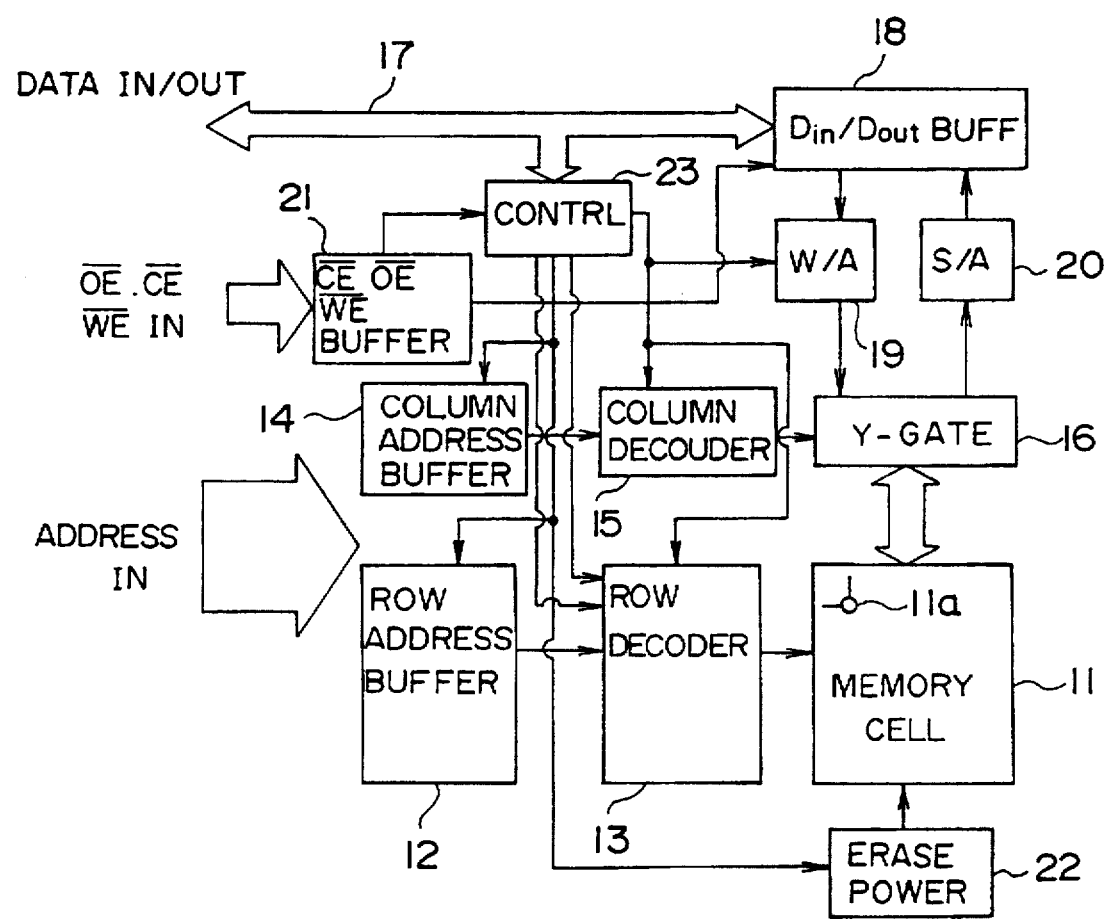
FIG. 3 is a circuit diagram showing an overall construction of a typical conventional flash memory device.

Referring to FIG. 6, the flash memory of the present embodiment includes the memory cell array schematically illustrated in the form of the memory cell transistor 11a, wherein the control circuit 23 of the flash memory as represented schematically in FIG. 3 includes a signal generator 233 that is supplied with an output signal PGM of the buffer circuit 21 in response to the write enable signal /WE when writing data. There, the circuit 233 produces a first control signal PGMR and a second control signal PGMC in response to the signal PGM, wherein the signal PGM causes a transition to the high level state during the interval in which the writing of data is achieved. The circuit 231 in turn produces a gate voltage $V_G$ in response to the signal PGMC and the voltage level of the control gate represented as "G" in FIG. 6 is held at a high level state corresponding to the voltage $V_H$ during the interval in which the signal PGMC assumes the high level state. The circuit 232 in turn produces a drain voltage represented as $V_D$ in FIG. 6 such that the drain voltage $V_D$ is held at the level $V_M$ during the high level interval of the signal PGMC.

Figure 4:
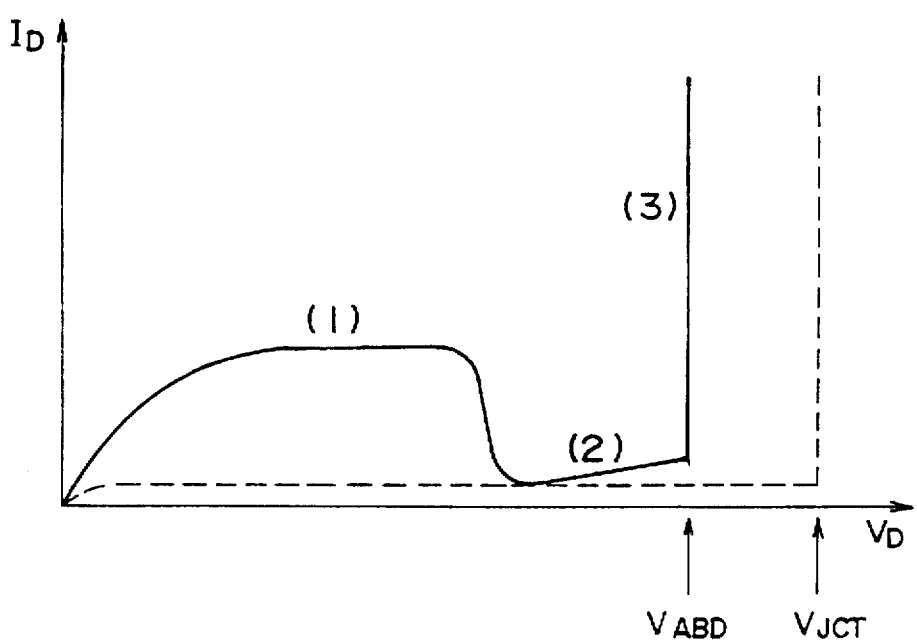
FIG. 4 is a diagram showing an injection of electrons into a floating gate of the flash memory.

In the present embodiment, in order to guarantee that the drain voltage $V_D$ shown in FIG. 4 is clamped at the avalanche voltage $V_{ABD}$, the gate voltage $V_G$ is set to the high level state $V_H$ before the drain voltage $V_D$ rises to the high level state $V_M$, and the gate voltage $V_G$ maintains the high level state even after the drain voltage $V_D$ has caused a transition to the low level state. Thereby, the problem of the drain voltage $V_D$ exceeding the voltage $V_{ABD}$ is successfully avoided and the problem of disturb or interference between the memory cell transistors is eliminated.

FIG. 7 shows the circuit diagram of the circuit 233.

Referring to FIG. 7, it will be noted that the circuit 233 includes an inverter 233a supplied with the signal PGM and produces an output as a logic inversion of the signal PGM. The output of the inverter 233a is supplied on the one hand to a NAND gate 233d and on the other hand to a NOR gate 233e, wherein the NAND gate 233d and the NOR gate 233e form a flip-flop circuit that includes a first feedback path for feeding back the output of the NAND gate 233d to another input terminal of the NOR gate 233e via an inverter 233b and a second feedback path for feeding back the output of the NOR gate 233e to another input terminal of the NAND gate 233d via an inverter 233c. Thereby, the output signals PGMR and PGMC are obtained respectively at the output of the NAND gate 233d and the output of the NOR gate 233e with a timing relationship as shown in FIGS. 8(A)–8(C), wherein FIG. 8(A) shows the waveform of the signal PGM, FIG. 8(B) shows the waveform of the signal PGMR, and FIG. 8(C) shows the waveform of the signal PGMC.

Referring to FIGS. 8(A)–8(C), it will be noted that PGMR rises substantially in synchronization to the leading edge of the PGM, while the leading edge of the PGMC is delayed with respect to the leading edge of the PGM by an interval $td_1$, wherein the interval $td_1$ corresponds to the delay caused by the NAND gate 233d and the inverter 233b. In other words, the delay $td_1$ is set such that the rise of the drain voltage $V_D$ occurs after the rise of the gate voltage $V_G$ in the circuit 233 of FIG. 7. Further, it should be noted that the PGMC causes a transition to the low level state substantially in synchronization with the trailing edge of the PGM, while the trailing edge of the PGMR appears after a delay of $td_2$ with respect to the trailing edge of the PGM, wherein the delay $td_2$ is determined by the delay caused by the NOR gate 233e and the inverter 233c. Again, the delay $td_2$ is determined such that the gate voltage returns after the drain voltage returns to the low level state. This indicates that the gate voltage $V_G$ is held at the high level state $V_H$ for a while, even when the drain voltage $V_D$ has caused a transition to the low level state. As a result of the timing relationship shown in FIGS. 8(A)–8(C), it will be noted that in no moment the situation occurs wherein the drain voltage $V_D$ rises while the gate voltage $V_G$ is held at the low level state. Thereby, the voltage level $V_D$ never rises beyond the avalanche voltage $V_{ABD}$, and the problem of the disturbance described earlier is effectively eliminated.

Figure 5:
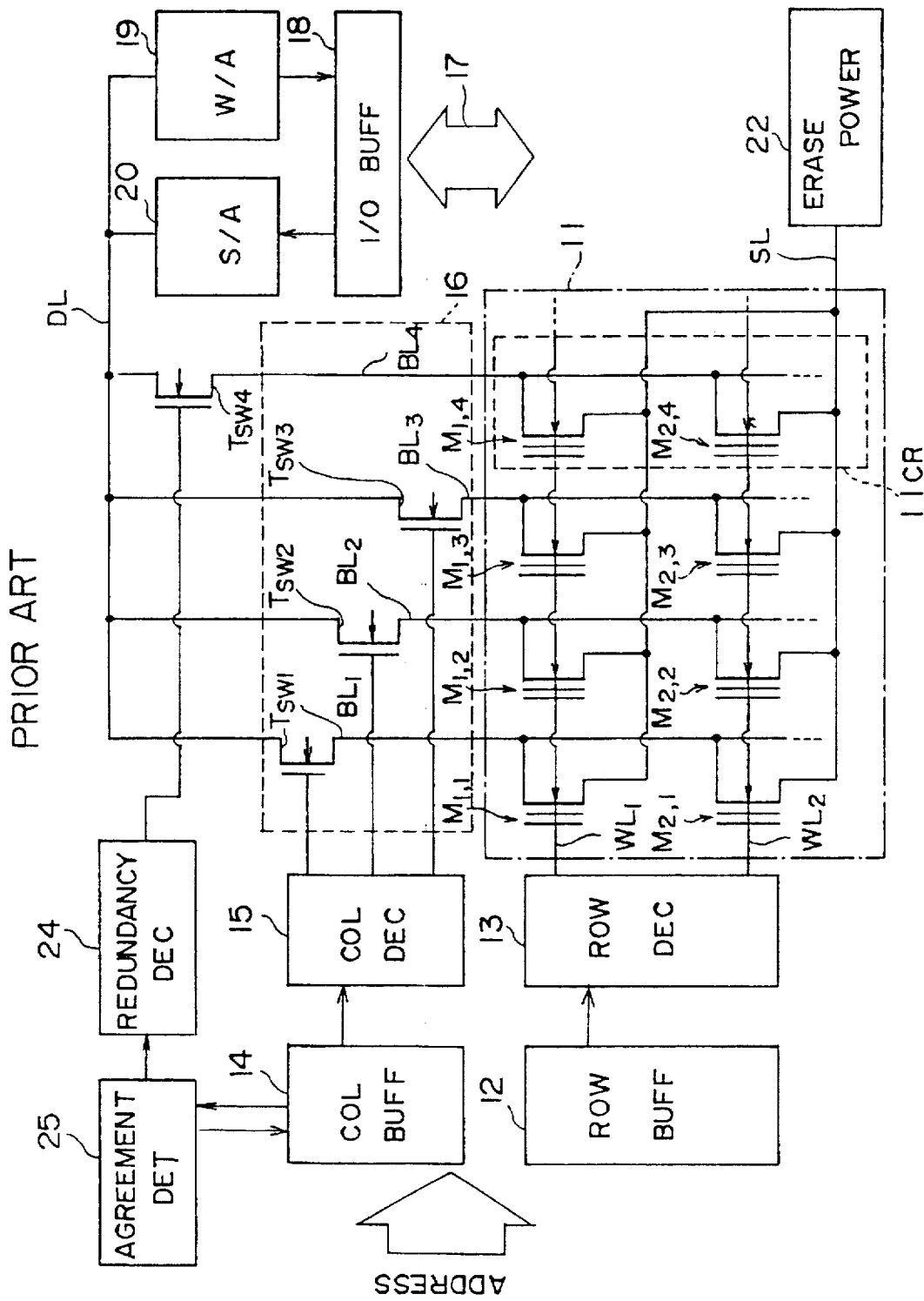
FIG. 5 is a block diagram showing the structure of a conventional flash memory having a column redundancy.
Figure 9:
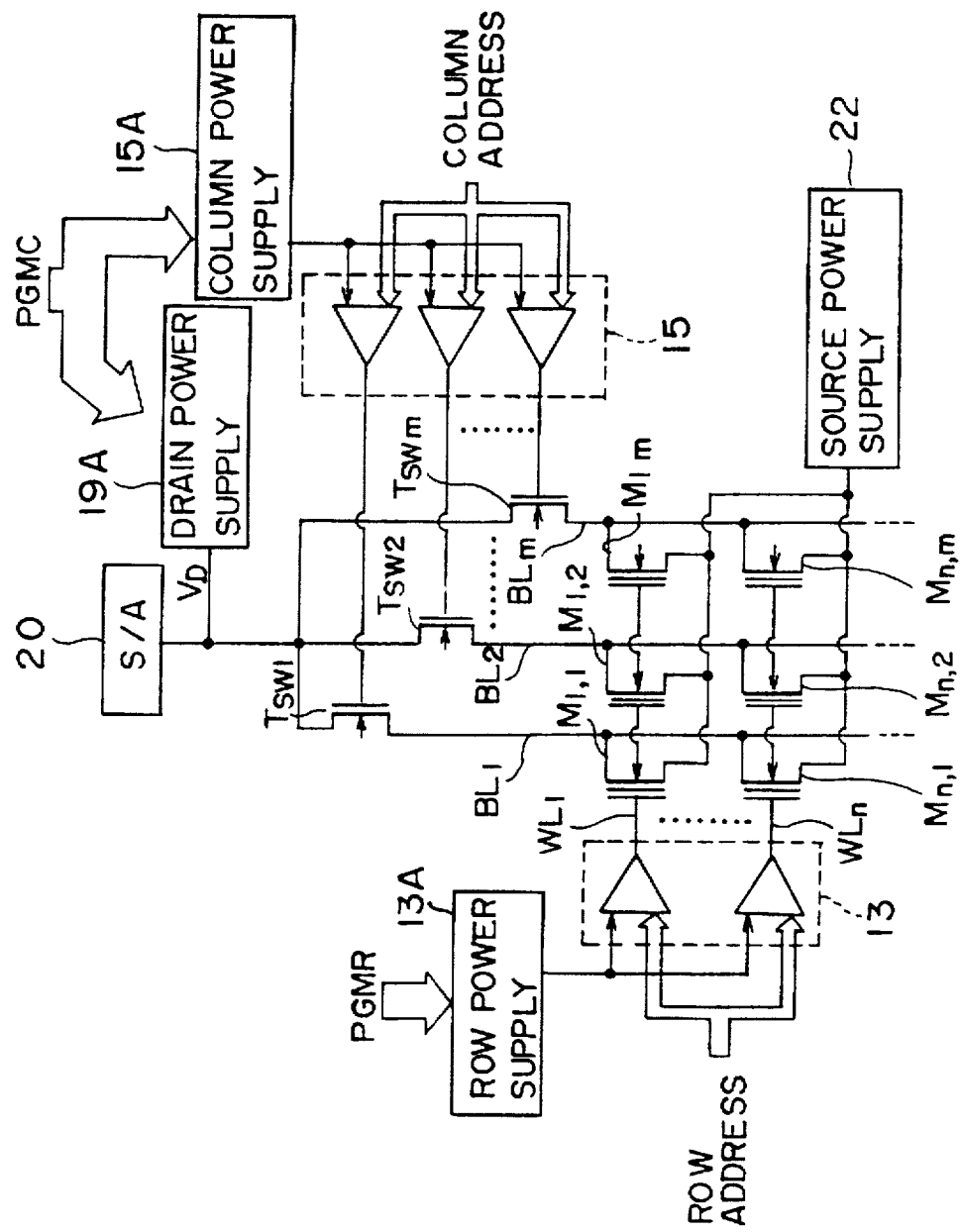
FIG. 9 is a block diagram showing the overall construction of a flash memory that uses the control circuit of FIG. 7.

FIG. 9 is a block diagram similar to FIG. 5 and shows the construction of the memory device that uses the foregoing circuit 233 for the formation of the signals PGMR and PGMC. In FIG. 9, those parts corresponding to FIG. 5 are designated by the same reference numerals and the description will be omitted.

Referring to FIG. 9, it will be noted that the PGMR is supplied to a row selection power supply circuit 13A that produces the output signal $V_G$ in response to the high level state of the PGMR, and the signal $V_G$ is supplied to the row decoder 13 to which the row address data is supplied simultaneously. There, the row decoder 13 selects a word line such as $WL_1$ in response to the row address data supplied thereto and supplies the gate voltage $V_G$ to the selected word line $WL_1$. Further, there is provided a column power supply circuit 15A that is supplied with the PGMC, wherein the circuit 15A activates the column decoder 15 in response to the high level interval of the PGMC. Further, the PGMC is supplied also to a drain power supply circuit 19A that forms a part of the write amplifier 20, and the drain voltage $V_D$ is controlled as already described with reference to FIGS. 8(A)–8(C) in response to the PGMC. As the chance that the gate voltage of the selected word line such as $WL_1$ remains low while the level of the voltage $V_D$ is held at the high level state $V_M$ is positively eliminated in the present construction, the drain voltage $V_D$ never increases beyond the avalanche voltage $V_{ABD}$, and the problem of the disturbance is successfully eliminated.

It should be noted that the delay times $td_1$ and $td_2$ are determined to be larger than the difference between the signal delay occurring in the conductor strip that transfers the signal PGMR from the circuit 233 to the control gate of the selected memory cell transistor and the signal delay occurring in the conductor strip for transferring the signal PGMC from the circuit 233 to the drain region of the selected memory cell transistor. It should be noted that the conductor strip used for carrying the signal PGMR is generally formed of polysilicon and the delay occurring in the conductor strip for transferring the signal PGMR is generally larger than the delay occurring in the conductor that transfers the signal PGMC. By setting the delay timed $td_1$ and $td_2$ as such, the phase relationship shown in FIGS. 8(B) and (C) is guaranteed also on the control gate and on the drain region of the memory cell transistor.

Figure 10:
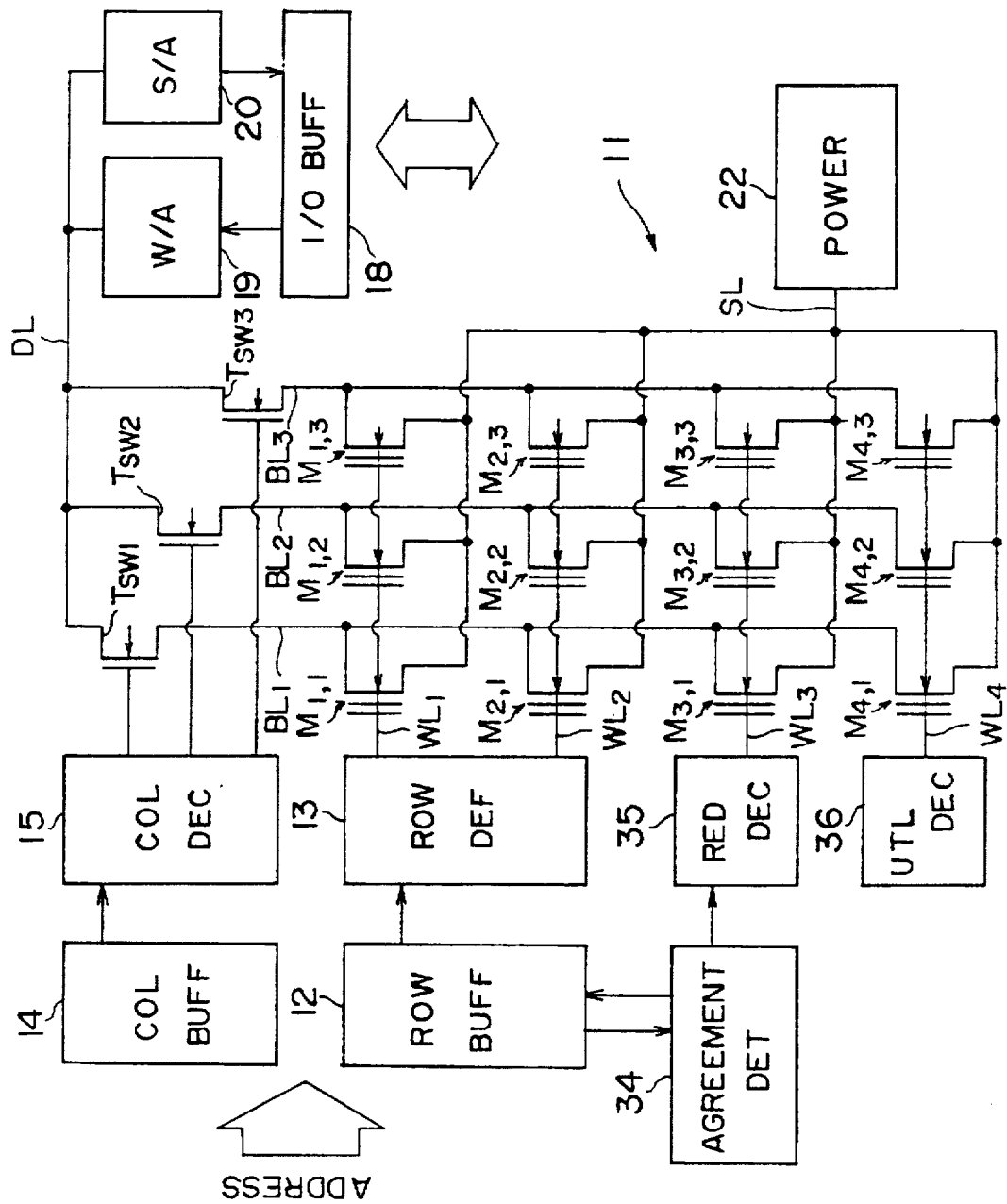
FIG. 10 is a block diagram showing the construction of a flash memory having a row redundancy according to a second embodiment of the present invention.

Next, a second embodiment of the present invention will be described with reference to FIG. 10, wherein the present embodiment relates to the flash memory device having the row redundancy. In FIG. 10, those parts corresponding to the parts already described with reference to FIG. 5 or FIG. 9 are designated by the same reference numerals and the description thereof will be omitted.

Referring to FIG. 10, the memory cell array 11 includes a row and column formation of the real memory cell transistors $M_{1,1}$–$M_{3,3}$ that are selected by the row decoder 13 and the column decoder 15 similarly to the embodiment of FIG. 5, wherein it will be noted that there is provided an additional memory cell block that includes memory cell transistors $M_{3,1}$–$M_{3,3}$ also in the memory cell array 11 as a row redundant memory cell block, and a defect detection circuit 34 for detecting the selection of a defective word line and a redundant word decoder 35 for selecting a redundant word line such as $WL_3$ in response to the output of the defect detection circuit 34, are provided for activating the row redundant memory cell block. Herein, the phrase "defective word line" means a word line to which a defective memory cell transistor is connected. In addition, there is provided an additional, utility memory cell block connected to a word line $WL_4$ that is selected by a utility word decoder 36. The utility memory cell block includes memory cell transistors $M_{4,1}$–$M_{4,3}$ and is used for testing the operation of the flash memory device.

Figures 1, 2:
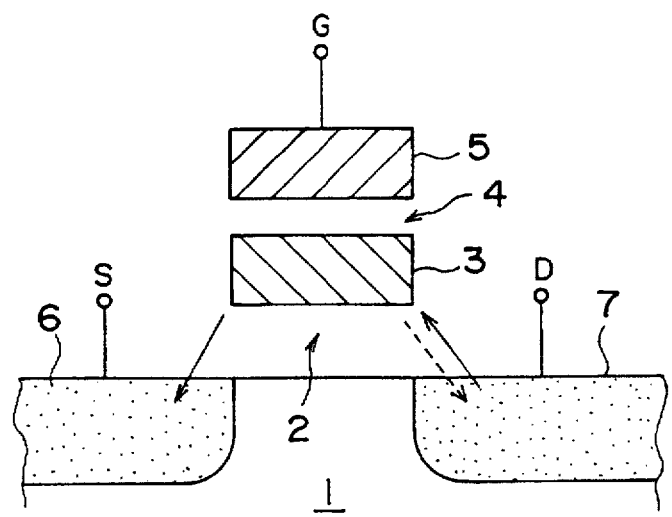
FIG. 1 is a diagram showing the structure and operation of a typical flash memory cell transistor.
FIG. 2 a diagram showing the biasing of the flash memory cell transistor for various operation of the memory device.
Figures 11, 12, 13:
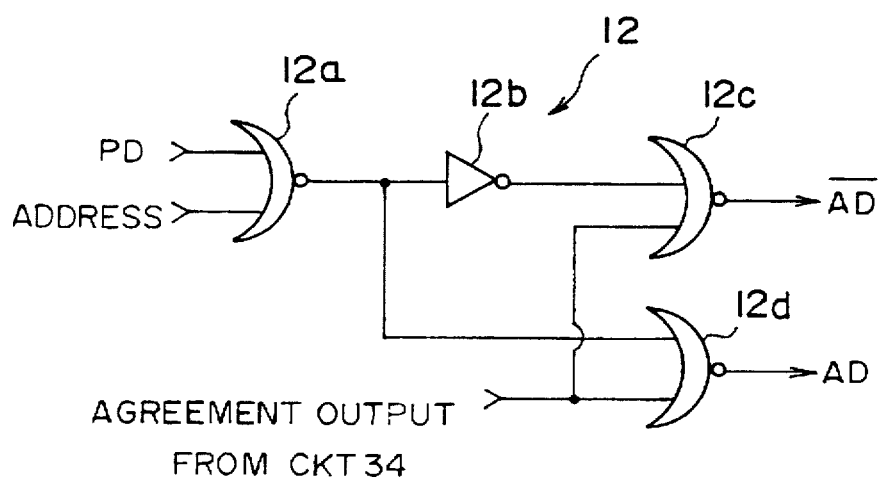
FIG. 11 is a diagram showing the biasing scheme used in the flash memory of FIG. 10 for erasing information.
FIG. 12 is a diagram similar to FIG. 11 for showing an alternative biasing scheme for erasing information in the second embodiment.
FIG. 13 is a circuit diagram showing the construction of a row buffer circuit used in the memory device of FIG. 12.

In the present embodiment, in order to avoid the problem of the excessive erasing of information from non-selected memory cells described previously in relation to the problem of row redundancy in the flash memory devices as well as the problem of the erase disturbance phenomenon, the present embodiment employs a construction to apply a large negative voltage $-V_E$ selectively to the control electrode of the memory cell transistor from which the information is to be erased, such that a dissipation of the electrons occurs from the floating gate to the substrate as indicated in FIG. 11. There, a positive voltage $V_L$ corresponding to the voltage $V_L$ described with reference to FIG. 2 is applied to the substrate of the device. At the same time, a zero or positive voltage is applied to the control electrode of the non-selected memory cells to avoid dissipation of the electric charges from the floating gate of the non-selected memory cells to the substrate. Typically, the voltage $V_E$ is set to −9 volts. Further, the dissipation of the electrons may be caused from the floating gate to the source region by applying the voltage $V_E$ to the control gate and the voltage $V_L$ to the source simultaneously as indicated in FIG. 12. By controlling the erasing operation of the flash memory device as such, the problems of the excessive erasing and the erase disturb associated with the row redundancy are effectively eliminated. In addition, such a construction enables the use of the utility memory cell block that may be used for the testing the rewriting operation. Conventionally, such a utility memory cell block could not be provided on the same chip of the memory cell device because of the problem of the excessive erasing.

In order to achieve the foregoing object, the present embodiment shown in FIG. 10 employs a construction of the row address buffer circuit 12 as shown in FIG. 13, wherein only a part of the circuit is illustrated. It should be noted, on the other hand, that the power supply 22 is no longer used for the erasing purpose. Thus, the power supply 22 merely produces zero volt or a voltage corresponding to the level $V_H$.

Referring to FIG. 13, the circuit 12 includes a NOR gate 12a that is supplied on the one hand with a control signal PD that is set to the low level state during the operational state of the flash memory device and on the other hand with an address signal included in the multiple-bit address data, wherein the output of the NOR gate 12a is supplied to a first input terminal of another NOR gate 12c via an inverter 12b. Further, the output of the NOR gate 12a is supplied to an input terminal of a NOR gate 12d. There, both the NOR gate 12c and the NOR gate 12d are supplied with an output of the defect detection circuit 34 simultaneously, wherein the defect detection circuit 34 produces the output such that the output of the circuit 34 assumes a high level state when a selection of the defective word line is made. When the defect-free word line is selected, on the other hand, the output of the circuit 34 is of course set to the low level state. When the output of the circuit 34 assumes the high level state, it will be noted that both the output signal AD of the NOR gate 12c and the output signal /AD of the NOR gate 12d are set to the low level state. It should be that the circuit of FIG. 13 is provided in number corresponding to the number of the bits of the address data to form the address buffer circuit 12.

Figure 14:
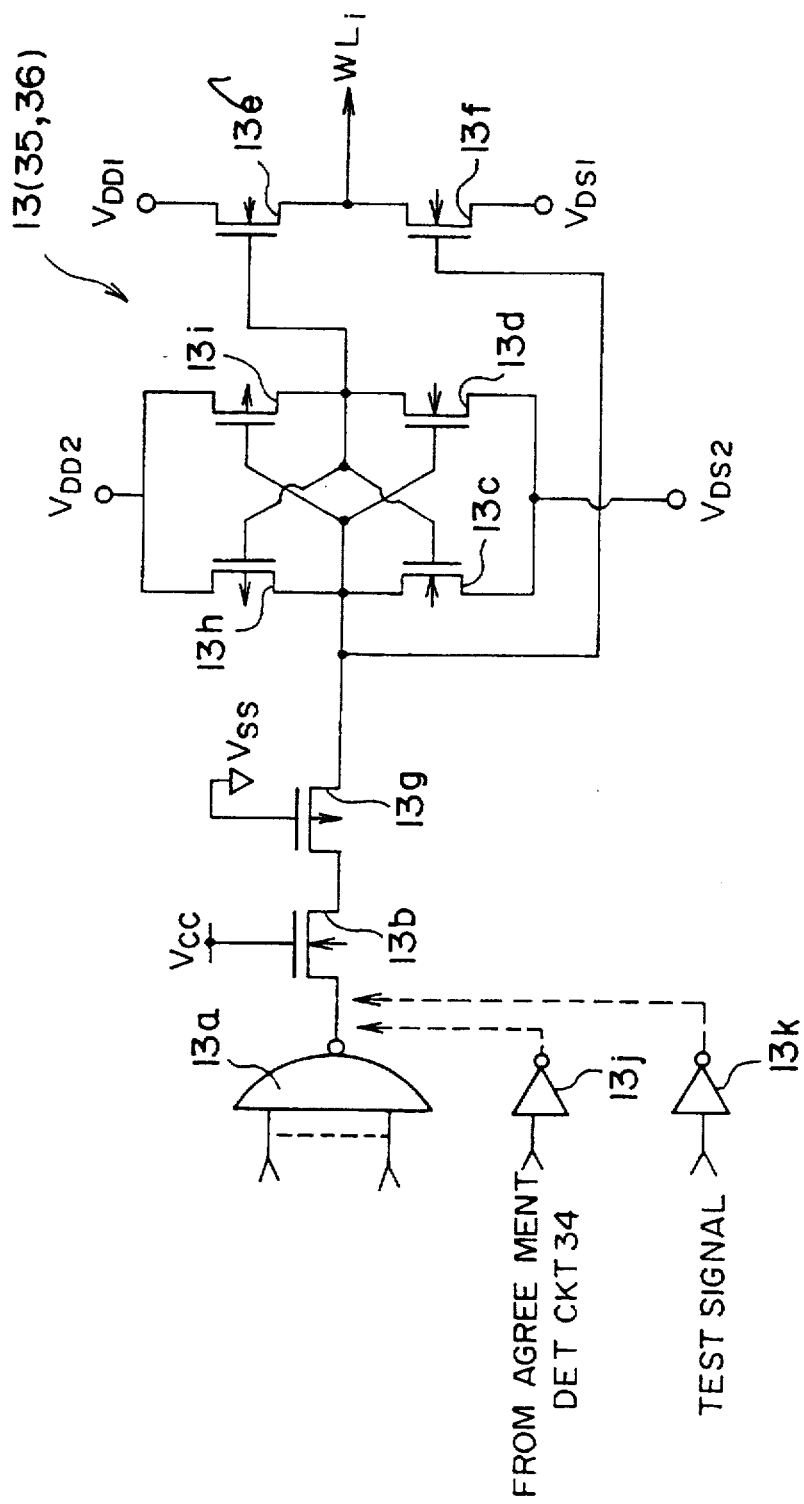
FIG. 14 is a circuit diagram showing the construction of a row decoder used in the memory device of FIG. 12.

FIG. 14 shows the construction of the row decoder 13, wherein the row decoder 13 includes a NAND gate 13a that receives the address data from the row address buffer circuit 12. There, the output of the row decoder 13 is supplied, via an n-channel MOS transistor 13b and a p-channel MOS transistor 13g both urged to a turned-on state by the supply voltages $V_{cc}$ and $V_{ss}$ respectively, to a latch circuit that includes a p-channel MOS transistor 13h and an n-channel MOS transistor 13c connected in series between a power supply voltage $V_{DD2}$ and another power supply voltage $V_{DS2}$. The latch circuit further includes a p-channel MOS transistor 13i and an n-channel MOS transistor 13d connected in series between the foregoing power supply voltages $V_{DD2}$ and $V_{DS2}$, wherein the transistors 13h and 13i as well as the transistors 13c and 13d are connected such that the voltage at the node between the transistors 13h and 13c is supplied to the respective gates of the transistors 13i and 13d and such that the voltage at the node between the transistors 13i and 13d is supplied to the respective gates of the transistors 13h and 13c. The output of the latch circuit is obtained at the node between the transistors 13i and 13d and is supplied to the gate of an n-channel MOS transistor 33e that is connected in series to another n-channel MOS transistor 13f. There, the transistors 13e and 13f are connected in series between a supply voltage $V_{DS1}$ and a supply voltage $V_{DS2}$, wherein the transistor 13f is supplied with the output of the transistor 13g directly. Thereby, the control voltage to be outputted on the word line $WL_i$ (i=1, 2, . . .) is obtained at the node between the transistor 13e and the transistor 13f.

In the construction of FIG. 14, the voltage $V_{cc}$ is typically set to +5 volts while the voltage $V_{ss}$ is set typically to zero volt. Further, it should be noted that the voltages $V_{DD1}$ and $V_{DS2}$ are set, in the erasing mode, to the foregoing negative voltage $V_E$ that is applied to the control gate of the memory cell transistor for erasing data therefrom. On the other hand, the voltages $V_{DD2}$ and $V_{DS1}$ correspond to the voltage $V_L$ that is supplied to the substrate in the erasing scheme of FIG. 11. In the erasing mode shown in FIG. 12, the voltage $V_L$ is supplied to the source region. Anyway, it will be noted that the circuit of FIG. 14 outputs the control voltage on the selected word line $WL_i$ such that the control voltage is set to the level $V_E$ in the erasing mode. It should be noted that the NAND gate 13a produces a low level output in response to the address data that selects the word line $WL_i$. On the other hand, when the word line is not selected, the NAND gate 13a produces a high level output and a control signal having the level $V_L$ is outputted on the non-selected word line in response thereto.

A similar construction is used for the row redundant word line decoder 35 and the utility word line decoder 36. In the case of the row redundant word line decoder 35, the NAND gate 13a is replaced by an inverter 13j that is supplied with the output signal from the defect detection circuit 34. Similarly, an inverter 13k is used in place of the NAND gate 13a in the utility word line decoder 36, wherein the inverter 13k produces an output in response to a test signal supplied thereto. Thus, when the row redundant word line decoder 35 is activated in response to the selection of a defective word line, the redundant word line $WL_3$ shown in FIG. 10 is selected and the voltage level of the redundant word line $WL_3$ is urged to the level $V_E$ in correspondence to the supply voltage $V_{DD1}$ when erasing data. Simultaneously, the rest of the word lines are all urged to the voltage $V_L$ in correspondence to the supply voltage $V_{DS1}$. In other words, the flash erasing operation applied to the row redundant memory cell block does not cause the adversary erasing in the real memory cell block. A similar argument applies also to the utility memory cell block connected to the word line $WL_4$. There, the erasing operation applied to the utility memory cell block for testing the device operation can be achieved independently from the rest of the memory cells and the problem of the excessive erasing is eliminated.

In the foregoing construction of the row decoder 13 shown in FIG. 14, it will be noted that one has to set the supply voltages $V_{DD1}$ and $V_{DD2}$ to another voltage level different from $V_E$ in the writing mode and in the reading mode. As shown in FIG. 2, one has to set the word line voltage of the selected word line to a large positive level $V_H$ in the writing mode while in the reading mode, the word line voltage has to be set to the level $V_L$.

Figure 15:
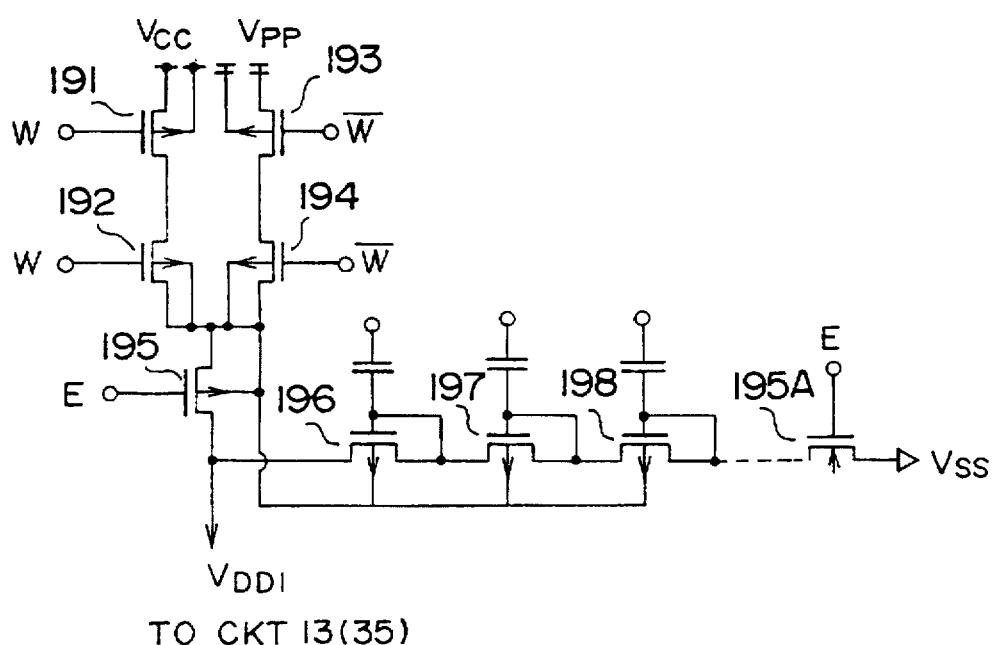
FIG. 15 is a drive of the row decoder for producing different word line voltages.

FIG. 15 shows a circuit 13X for causing the foregoing change of the supply voltage $V_{DD1}$ in response to the operational mode of the flash memory device.

Referring to FIG. 15, the circuit 13X forms a part of the circuit 13 we well as 35 and 36 in the illustration of FIG. 10 and includes a p-channel transistor 191 having a source connected to the supply voltage $V_{CC}$ and a p-channel transistor 192 connected in series to the transistor 191. Further, there is provided a p-channel transistor 193 having a source connected to the supply voltage $V_{PP}$ and another p-channel transistor connected in series to the transistor 193. The respective sources of the transistors 192 and 195 are connected commonly to another p-channel transistor 195 that is turned on in response to the erase control signal E. There, the transistors 191 and 192 have respective gates supplied with the write control signal W while the transistors 193 and 194 have respective gates supplied with the complementary write control signal /W.

Thus, when operated in the reading mode wherein the signal W is high, the transistors 191 and 192 are turned on while the transistors 193 and 194 are turned off, and the supply voltage $V_{CC}$ is supplied to the transistor 195. In the mode other than erasing, the control signal E takes a low level state and the supply voltage $V_{CC}$ thus supplied via the transistors 191 and 192 is supplied further through the transistor 195 to the supply terminal $V_{DD1}$ of the circuit 13 shown in FIG. 14. Similarly, when the signal W is high in correspondence to the writing mode, the transistors 193 and 194 are turned on while the transistor 191 and 192 are turned off, and the high positive supply voltage $V_{PP}$ is supplied to the terminal $V_{DD1}$ via the transistor 195 that is turned on in response to the non-erasing mode.

Further, the circuit of FIG. 15 includes a number of p-channel transistors 196, 197, 198, . . . connected to form a diode wherein the transistors 196, . . . are connected in series to the supply voltage $V_{SS}$ via an n-channel transistor 195A that is turned on and turned off in response to the erase control signal E. In the non-erase mode, the transistor 195A is turned off in response to the low level state of the control signal E, and the transistors 196, 197, 198, . . . are disconnected from the supply voltage $V_{SS}$.

On the other hand, in the erasing mode, the signal E takes a high level state and the transistor 195 turns off while the transistor 195A is turned on. Thereby, the supply voltage $V_{SS}$ is supplied after voltage drop caused by the diode connection of the transistors 196, . . . and a large negative voltage corresponding to $V_E$ appears at the terminal $V_{DD1}$ of the circuit 13 of FIG. 14. In the circuit of FIG. 15, it should be noted that the transistors 196, 197, . . . are supplied with a clock signal $\phi$ and a logic inversion $/\phi$.

Next, a third embodiment of the present invention will be described with reference to FIG. 16, wherein FIG. 16 shows a device that has a column redundancy. In FIG. 16, those parts described previously are designated by the same reference numerals and the description thereof will be omitted.

In the present embodiment, the memory cell array 11 is divided into a number of memory cell blocks $11_1 \ldots 11_m$, wherein each memory cell block has a corresponding erase power supply $22_1, \ldots 22_m$ for supplying the source drive voltage of the flash memory cells such that the flash-erasing of information occurs in each memory cell block independently. Further, there is provided a redundant memory cell column $11_{CR}$ corresponding to the column redundant memory cell array shown in FIG. 5, and the redundant memory cell column $11_{CR}$ receives the source drive voltage from an independent erase power supply $22_{CR}$. Similar to the device of FIG. 5, the redundant memory cell block $11_{CR}$ is selected in response to the output from the defect detection circuit 25. In the illustration of FIG. 16, the redundant decoder 24 is included in the column decoder 15. In addition, there may be provided a utility memory cell column $11_{UT}$ for testing the device, wherein the memory cell column $11_{UT}$ is selected in response to a test signal that is supplied to the column decoder 18 when testing the flash memory device. In the memory cell column $11_{UT}$, too, a power supply $22_{UT}$ is provided. In the device of FIG. 16, it should be noted that each of the memory cell blocks $11_1-11_m$ includes only the real memory cells. In other words, the memory cell blocks $11_1-11_m$ does not include the redundant memory cell column or utility memory cell column.

Figure 17:
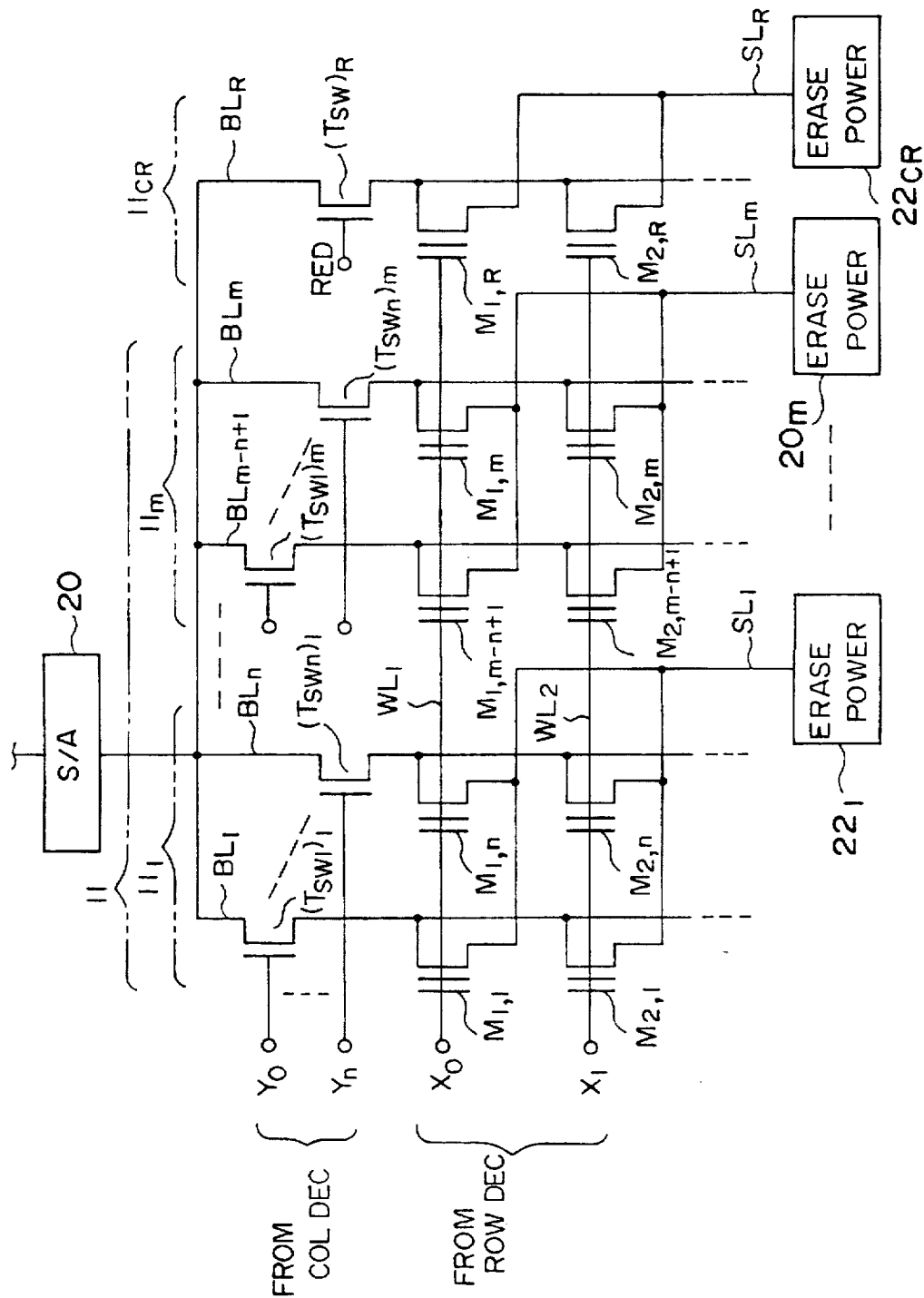
FIG. 17 is a block diagram showing the essential part of the memory device of FIG. 16.

FIG. 17 is a circuit diagram showing a part of the device of FIG. 16 in detail. In FIG. 17, those parts described previously are designated by the same reference numerals and the description will be omitted.

Referring to FIG. 17, it will be noted that n bit lines such as the bit lines $BL_1$–$BL_n$ are grouped to form a memory cell block such as $11_1, \ldots 11_m$ wherein no redundant memory cell column is included in each memory cell block. There, each memory cell block is activated by a corresponding power supply unit such as $22_1, \ldots 22_m$ via source supply lines $SL_1-SL_m$ and the flash-erasing or simultaneous erasing of information is achieved within each memory cell block. According to the construction of FIG. 17, the area that is occupied by the redundant memory cell column can be reduced as compared with the conventional redundant construction wherein the redundant memory cell column is provided in each of the memory cell blocks. As the redundant memory cell column is activated explicitly by the power supply unit $22_{CR}$ the erasing of the redundant memory cell block $11_{CR}$ does not cause the problem of the excessive erasing in the real memory cell array 11. Of course, there may be a plurality of memory cell columns included in the redundant memory cell column $11_{CR}$.

FIG. 18 shows a modification of the device of FIG. 16 wherein the memory cell array 11 is formed of a single row and column formation of the memory cell transistors $M_{1,1}-M_{m,m}$, wherein the device further includes the utility memory cell column $11_{UT}$. As shown in FIG. 18, the utility memory cell column $11_{UT}$ includes memory cells $M_{1,U}$, $M_{2,U}, \ldots$, wherein each of the memory cells $M_{1,U}, \ldots$ have the source region connected commonly by a source supply line $SL_U$ to the power supply unit $22_{UT}$ that is provided independently from the power supply unit 22 that supplies the source voltage to the memory cell transistors in the memory cell array 11. There, the power unit $22_{UT}$ changes the supply voltage in response to the operational mode particularly in the erasing mode as already described with reference to the basic operation of the flash memory device such that the supply voltage is changed independently to the supply voltage that is supplied to the source of the memory cell transistors $M_{1,1}-M_{m,m}$ from the power supply unit 22.

The utility memory cell column $11_{UT}$ of FIG. 18 may be used for example for the testing purpose for guaranteeing the number of times the device is capable of rewriting as already described, wherein the device of the present embodiment is advantageous in the point that the erasing operation of the utility memory cell column $11_{UT}$ does not affect at all the state of the real memory cell array 11 because of the use of the separate, independent power supply unit $22_{UT}$ for effecting a connection of the bit line $BL_U$ to the sense amplifier 20. In operation, a test control signal is supplied to the gate of the column gate transistor $(Tsw)_{UT}$. It should be noted that such a testing of the device has been impossible in the conventional device that uses only one power supply unit, as such a test for rewriting data in the utility memory cell column inevitably causes an excessive erasing in the real memory cell array unless rewriting of data is achieved simultaneously to the utility memory cell column. Of course, such a simultaneous rewiring of the data in the real memory cell array inevitably invites shortened lifetime of the device before the device is actually shipped to the user. The present embodiment can solve this problem successfully without complicating the design of the device.

Next, a fourth embodiment of the present invention will be described with reference to FIG. 19, wherein those parts corresponding to the parts described previously are designated by the same reference numerals and the description will be omitted.

Referring to FIG. 19, the memory cell array 11 is divided into a plurality of memory cell blocks $11_1-11_m$, wherein the device further includes a redundant memory cell column $11_{CR}$ and a utility memory cell column $11_{UT}$. Each memory cell block includes a plurality of bit lines connected commonly to a source of a MOS transistor that forms the switch $S_1$ to be described below. There, the memory cell blocks $11_1-11_m$ as well as the memory cell columns $11_{CR}$ and $11_{UT}$ are connected to the sense amplifier 20 and the write amplifier 19 via a common output line DL wherein there are provided switches $SW_1-SW_{CR}$ for controlling the connection between the bit lines in the memory cell blocks $11_1-11_m$ and the output line DL as well as the connection between the bit lines included in the memory cell columns $11_{UT}$ and $11_{CR}$ and the output line DL. There, the switches $SW_1-SW_{CR}$ are supplied with a control signal $S_1-S_{CR}$ and are activated in response thereto. Further, each of the memory cell blocks and memory cell columns $11_1-11_{CR}$ has a corresponding power supply unit $22_1-22_{CR}$ for supplying the source voltage to the memory cell transistors included therein.

In the present embodiment, it should be noted that the power supply units $22_1-22_{CR}$ are designed to have respective output power or supply current that is optimized based upon the number of the memory cells included in the corresponding memory cell block or memory cell column. Hereinafter the optimization of the current output ability of the power supply units will be described in brief.

In the flash memory devices, the erasing of information is achieved by removing the electric charges from the floating electrode gate in the form of tunneling current. Thereby, there is a tendency that holes are created as a result of formation of the tunneling current and the holes thus created penetrate into the gate insulation film located under the floating gate. Thereby, the operational characteristics of the memory cell transistor is deteriorated. In fact, such an accumulation of the holes in the gate insulation film is one of the major reasons that limits the lifetime of a flash memory device.

Figure 20:
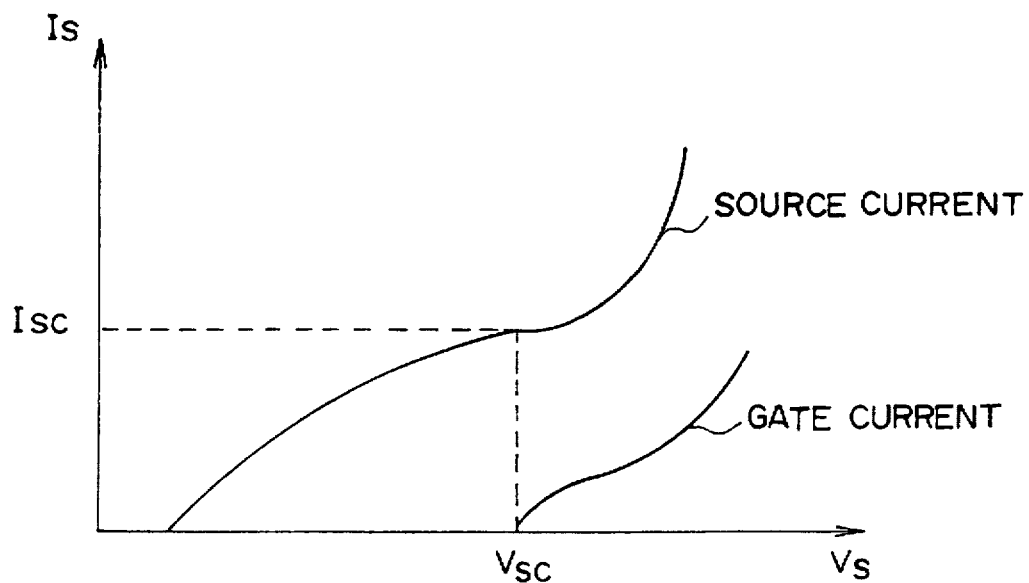
FIG. 20 is a diagram showing the erasing characteristics of a typical flash memory cell transistor.
Figure 21:
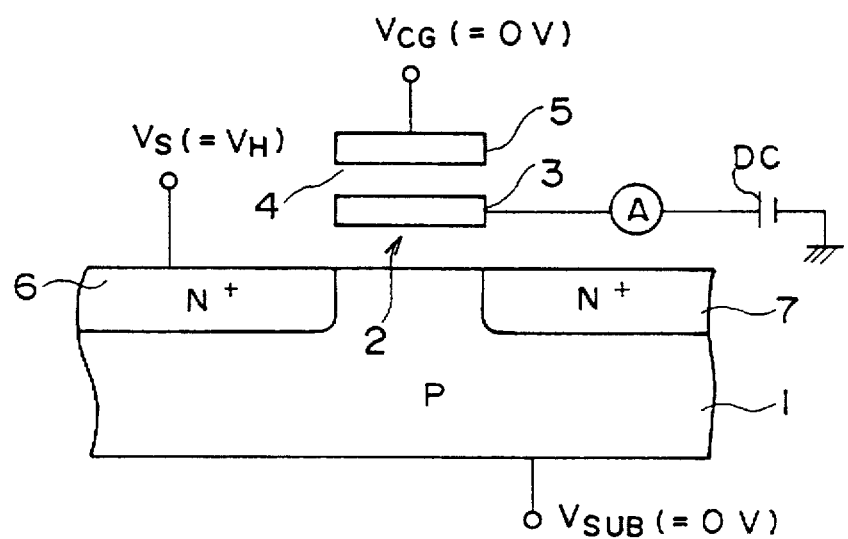
FIG. 21 is a diagram showing the biasing condition that provides the relationship of FIG. 20.
Figure 22A:
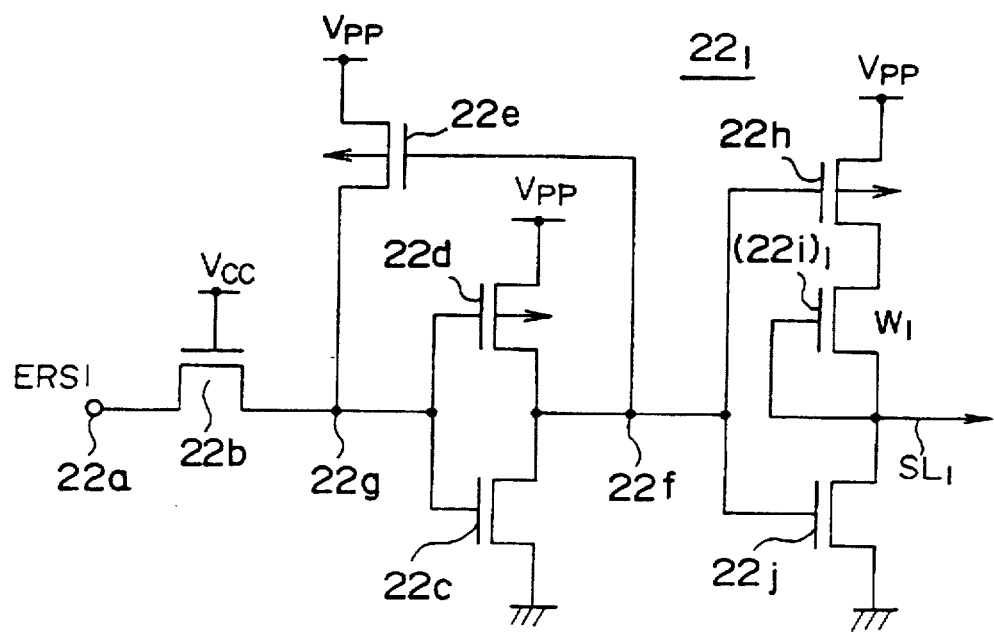
FIGS. 22(A)–22(D) are diagrams showing the optimization of the current supplying capability in the embodiment of FIG. 19 in conformity with the number of memory cell transistors included in the memory cell array.
Figure 22B:
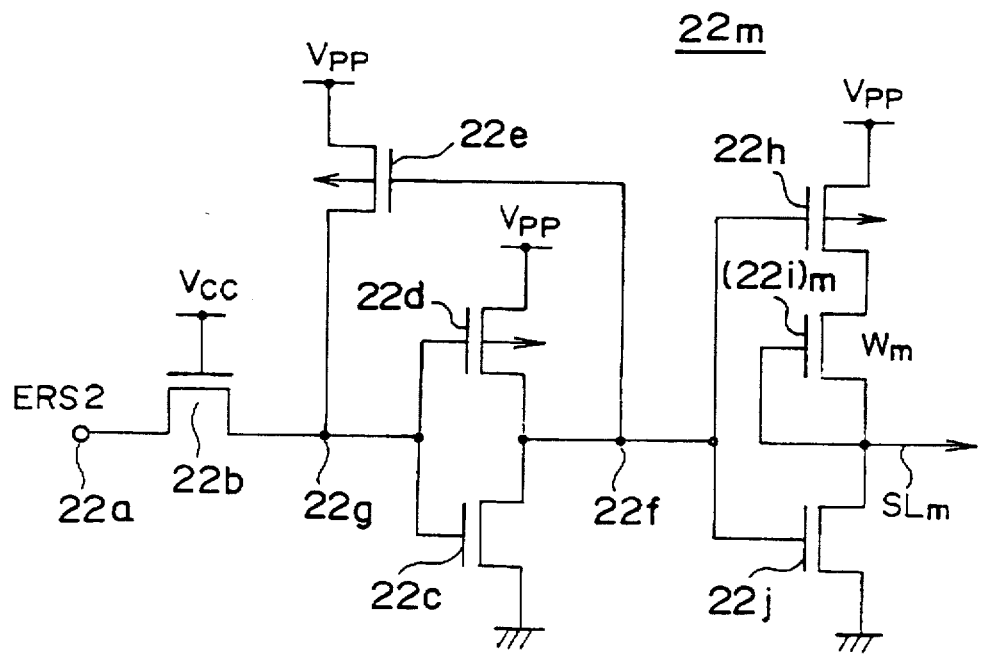
Figure 22C:
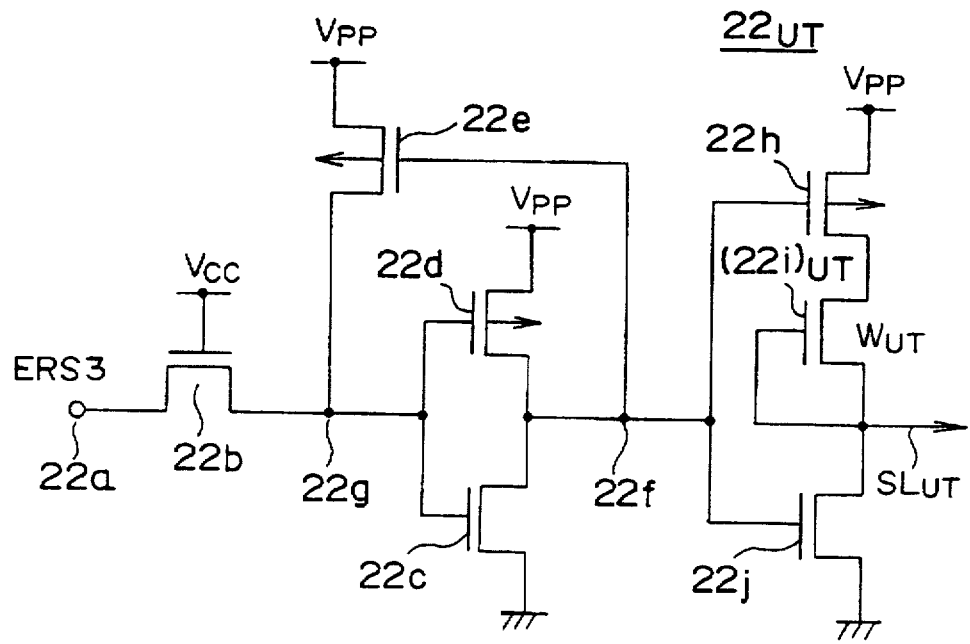
Figure 22D:
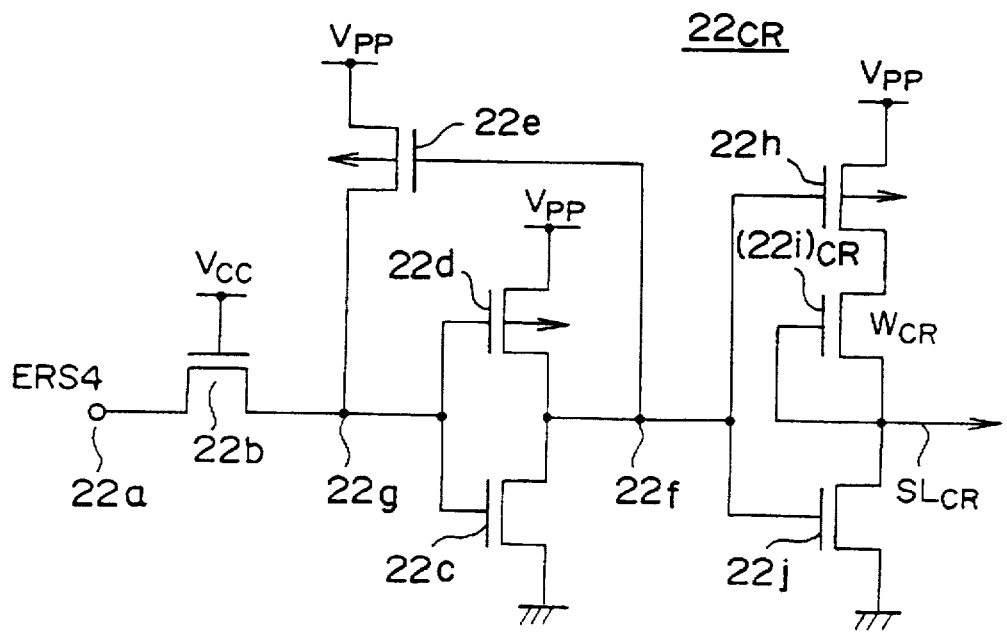

FIG. 20 shows the change of the source current with the source voltage applied to the memory cell transistor shown in FIG. 1 during the erasing operation, wherein FIG. 21 shows the condition that the erasing characteristics of FIG. 20 is obtained.

Referring to FIG. 21 first, the memory cell transistor shown in FIG. 1 is biased according to the erasing condition as set forth in FIG. 2, and a gate current that flows from the floating gate 3 to the source 6 is measured by applying a d.c. voltage to the floating gate. As shown in the result of FIG. 2, the source current $I_S$ increases gradually with increasing source voltage $V_S$ until a critical voltage $V_{SC}$ is reached above which the source current $I_S$ increases steeply due to the avalanche breakdown. The erasing of the information is achieved during this interval where the source current $I_S$ increases gradually with the source voltage $V_S$. Once the critical voltage $V_{SC}$ is attained, it will be noted that a gate current starts to flow from the floating gate electrode 3 to the source region 6 as indicated in FIG. 20. It will be noted that such a gate current indicates, in the usual erasing operation of the flash memory device wherein no external supply voltage is connected to the floating gate 3, that positive electric charges are created. In other words, there occurs the problem of the excessive erasing. Further, the holes thus created penetrate and induce a degradation in the gate insulation film.

Thus, in order to avoid the degradation of the gate insulation film and to maximize the lifetime of the device, it is essential to optimize the source voltage and hence the source current that is employed during the erasing operation. Particularly, the optimization of the source current is essential in each of the memory cell blocks and the memory cell columns in the configuration as shown in FIG. 19. In the utility memory cell column $11_{UT}$ in particular, it is essential to supply the source voltage such that the same source current flows in each memory cell transistor therein during the erasing operation as in the memory cell transistors in the memory cell blocks $11_1$–$11_m$. Otherwise, the result of the rewriting test conducted on the utility memory cell column becomes useless.

FIGS. 22(A)–22(D) show the construction of the power supply units $22_1$–$22_{UT}$, wherein the circuits shown therein have generally a similar connection. For example, the power supply unit $22_1$ has an input terminal $22a$ to which an erase control signal ERS3 is supplied. The erase control signal ERS3 thus supplied is further transferred to the gate of a p-channel MOS transistor $22d$ and an n-channel MOS transistor $22c$ connected in series between a supply voltage source $V_{PP}$ and the ground via a transfer gate transistor $22b$ that is urged to the turned-on state by a supply voltage $V_{CC}$ supplied to the gate thereof. There, the output obtained at the intermediate node between the transistors $22c$ and $22d$ is supplied on the one hand to the gate of a p-channel MOS transistor $22e$ that is connected between the supply voltage source and a node $22g$ connected to the gate of the transistors $22c$ and $22d$, and on the other hand to the gate of the transistors $22h$ and $22j$ that are connected in series between the power supply $V_{PP}$ and the ground with a transistor $(22i)_1$ interposed therebetween. There, the transistor $(22i)_1$ has a gate and a source connected with each other to form a constant current circuit, and the output of the circuit $22_1$ is obtained at the node where the transistor $(22i)_1$ is connected to the transistor $22j$. As will be noted later, the output transistor $(22i)_1$ has a gate width $W_1$ that is adjusted to supply an optimized output current to the source line $SL_1$ that is connected to the source of the memory cell transistors.

In the normal operation for reading or writing data, the node $22g$ takes a low level state in response to the low level state of the erase control signal $ERS_1$ that indicates the non-erasing mode, and the p-channel transistor $22d$ is turned on while the n-channel transistor $33c$ is turned off. Thereby, the node $22f$ is urged to the level $V_{PP}$ and the p-channel transistors $22e$ and $22h$ are turned off while the n-channel MOS transistor $41$ is turned on. As a result, the source line $SL_1$ is set to zero volt.

When the erase signal $ERS_1$ is set to the high level state in correspondence to the erasing operation, on the other hand, the level of the node $22g$ is urged to the Vcc level and the transistor $22c$ is turned on. As a result, the level of the node $22f$ approaches to zero and the p-channel transistors $22e$ and $22h$ are turned on while the n-channel transistor $22j$ is turned off.

In response to the turning-on of the p-channel transistor $22e$, the level of the node $22g$ rises to the level $V_{PP}$, and the p-channel transistor $22d$ is turned off. As a result, the level of the node $22f$ is urged to zero volt and the supply voltage $V_{PP}$ is supplied to the source line $SL_1$ via the p-channel transistor $22h$ and the n-channel transistor $(22i)_1$. Thereby, the erasing of information is achieved. A similar operation is achieved in the other circuits shown in FIGS. 20(B)–20(D). As the operation for these circuits is obvious, further description for the supply circuits of FIGS. 20(B)–20(D) will be omitted.

In the circuit of FIG. 20(A), it will be noted that the transistor $(22i)_1$ acting as a constant current source has a gate width $W_1$ that is set to provide a source current that is sufficient to erase the information from the memory cell transistors included in the memory cell block $11_1$. In other words, the gate width $W_1$ is set in accordance with the number of the memory cell transistors that are included in the memory cell block. More specifically, the gate width $W_1$ is set such that the power supply circuit $22_1$ has a capability of supplying the current $I_{SC}$ corresponding to the critical source voltage $V_{SC}$ to each of the memory cell transistors included in the memory cell block $11_1$. See FIG. 20. Thereby, an optimum source current is supplied to the memory cell transistors in the memory cell block $11_1$ when erasing information. Similarly, the output transistors $(22i)_m$, $(22i)_{UT}$ and $(22i)_{CR}$ have respective optimum gate widths $W_m$, $W_{UT}$ and $W_{CR}$. Thereby, there holds a relationship $$W_1/N_1 = W_m/N_m = W_{UT}/N_{UT} = W_{CR}/N_{CR},$$

where $N_1$, $N_m$, $N_{UT}$ and $N_{CR}$ respectively represent the number of the memory cell transistors that are included in the memory cell blocks $11_1$ and $11_m$ and in the memory cell columns $11_{UT}$ and $11_{CR}$. In correspondence to the foregoing relationship, the current supply capabilities $P_1$, $P_m$, $P_{UT}$ and $P_{CR}$ of the circuits $22_1$, $22_m$, $22_{UT}$ and $22_{CR}$ are related to each other according to the following relationship.

$$P_1/N_1 = P_2/N_2 = P_3/N_3 = P_4/N_4.$$

Next, a fifth embodiment of the present invention will be described with reference to FIG. 23 that shows the principle of the present embodiment.

Figure 23:
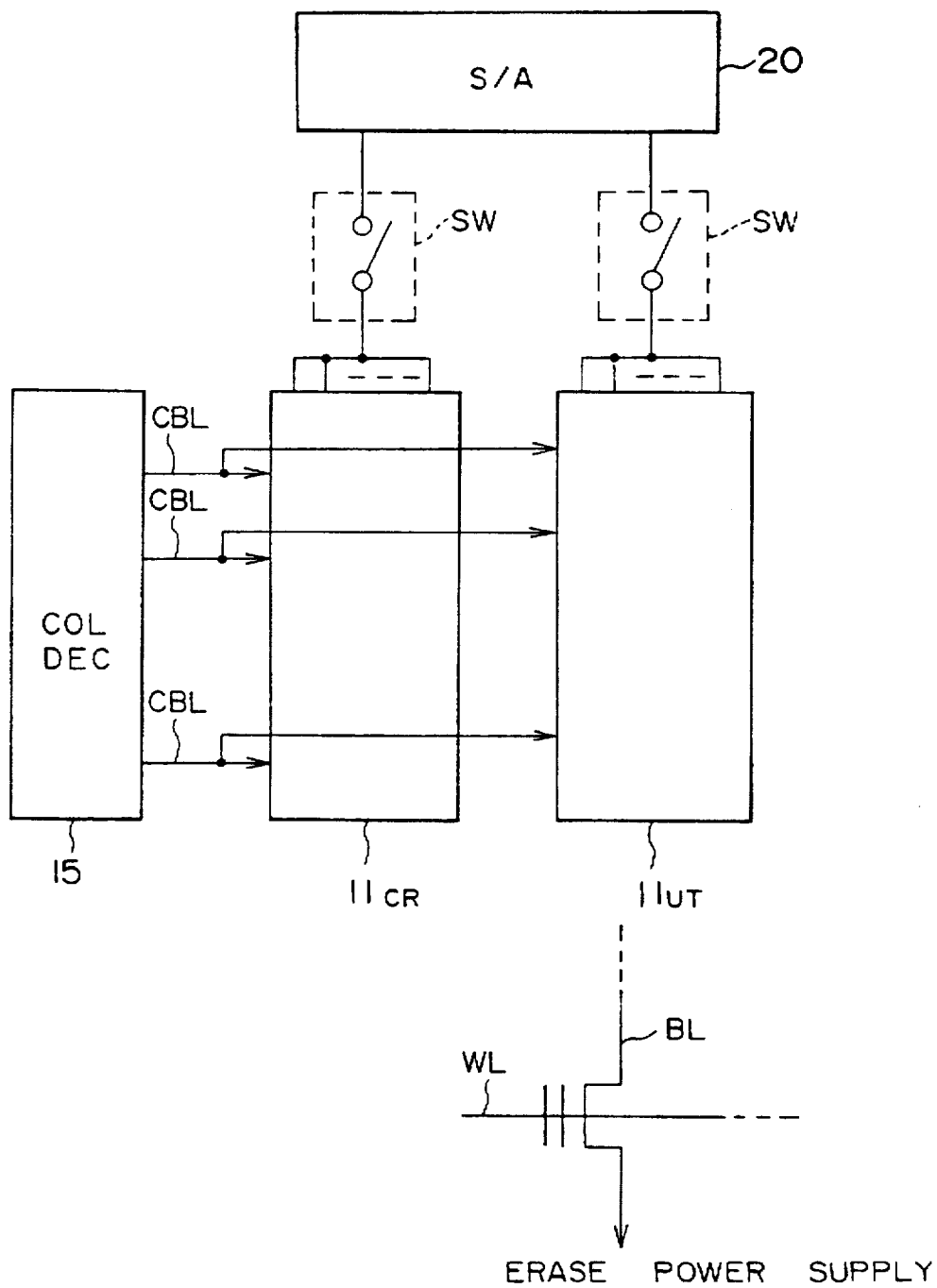
FIG. 23 is a block diagram showing the principle of a fifth embodiment of the present invention.

Referring to FIG. 23, the present embodiment employs the redundant memory cell block $11_{CR}$ and the utility memory cell block $11_{UT}$, wherein each of the blocks $11_{CR}$ and $11_{UT}$ include a plurality of memory cells arranged to form a matrix. In other words, the memory cell blocks $11_{CR}$ and $11_{UT}$ include a number of memory cell columns. There, it will be noted that the column decoder 15 is provided commonly to the memory cell blocks $11_{CR}$ and $11_{UT}$ for selecting a column selection line such as $BL_1$, wherein the selection of the column selection line $BL_1$ is achieved simultaneously in the memory cell block $11_{CR}$ and $11_{UT}$. Thereby, the information read out from the selected memory cell column is supplied to the sense amplifier 20 either via a switch circuit $SW_1$ or $SW_2$, wherein the switch circuit $SW_1$ is closed when the redundant memory cell block $11_{CR}$ is activated. On the other hand, when the utility memory cell block $11_{UT}$ is selected, the switch circuit $SW_2$ is closed. Thereby, the output of the memory cell block $11_{UT}$ and the memory cell block $11_{CR}$ is supplied to the sense amplifier 20 selectively.

Figure 24:
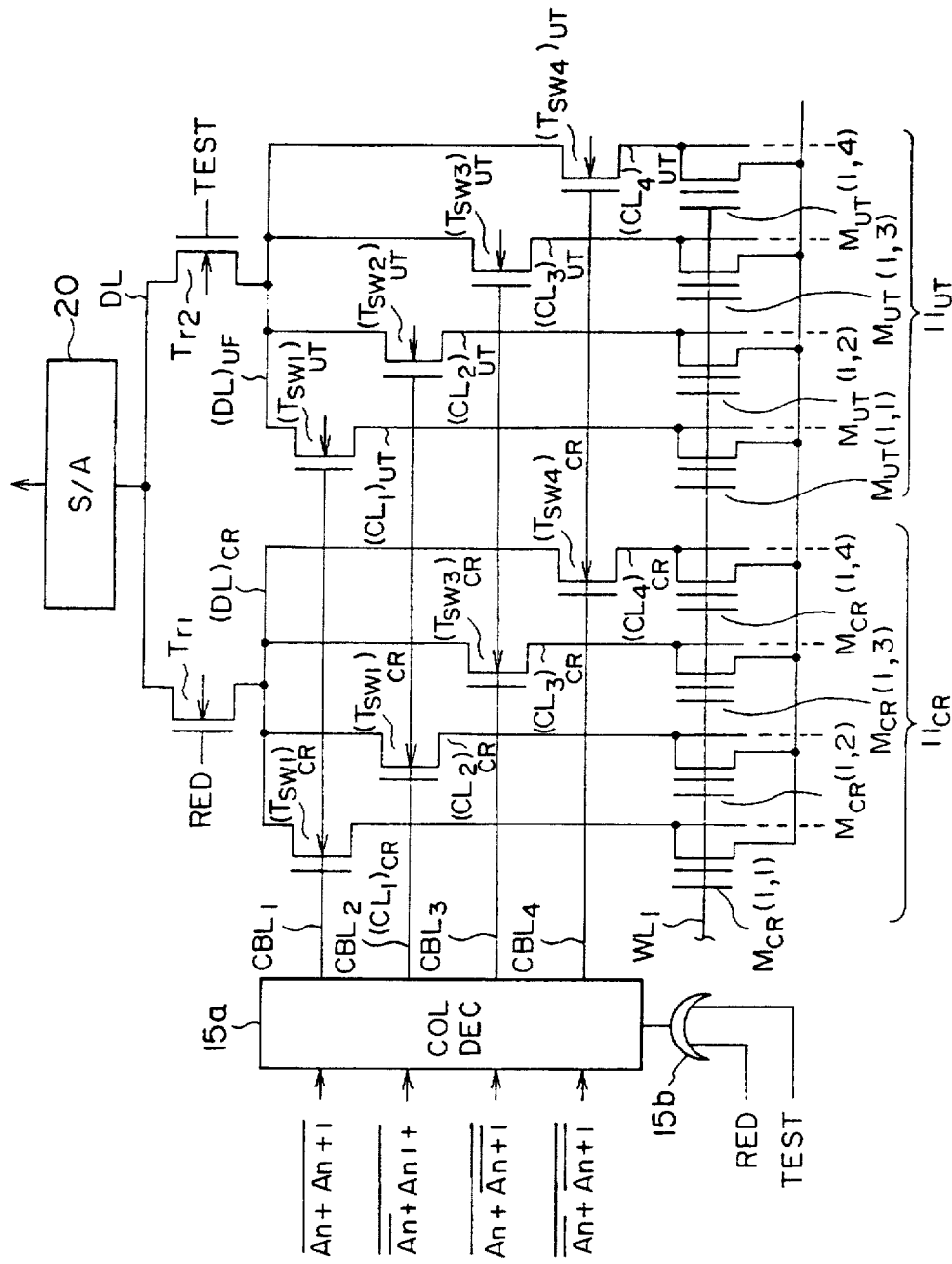
FIG. 24 is a block diagram showing the construction of the flash memory according to the fifth embodiment of the present invention.

FIG. 24 shows a more detailed representation of the circuit of FIG. 23.

Referring to FIG. 24, it will be noted that the redundant memory cell array $11_{CR}$ includes memory cell transistors $M_{CR}(1,1), \ldots$ arranged in rows and columns while the utility memory cell array $11_{UT}$ includes memory cell transistors $M_{UT}(1,1), \ldots$. There, the redundant memory cell transistors $M_{CR}(1,1), \ldots$ are connected to column lines $(CL_1)_{CR}, \ldots$ while the utility memory cell transistors $M_{UT}(1,1), \ldots$ are connected to column lines $(CL_1)_{UT}$. The column lines $(CL_1)_{CR}, \ldots$ are selected by column gate transistors $(Tsw1)_{CR}, \ldots$ in response to the output supplied by a final stage circuit or driver circuit $15a$ of the column decoder 15 to the column selection lines $BL_1, \ldots$, while the column lines $(CL_1)_{UT} \ldots$ are selected by column gate transistors $(Tsw1)_{UT}, \ldots$ in response to the output of the same driver circuit $15a$ outputted on the column selection lines $BL_1, \ldots$ There, it will be noted that the column selection lines $BL_1, \ldots$ are connected commonly to the corresponding column gate transistors $(Tsw1)_{CR}, \ldots$ for the redundant memory cell array $11_{CR}$ and to the column gate transistors $(Tsw1)_{UT}$ ... for the utility memory array $11_{UT}$. In each of the memory cell arrays $11_{CR}$ and $11_{UT}$, the drains of the column gate transistors are connected to a common drain line $(DL)_{CR}$ and a common drain line $(DL)_{UT}$, wherein the drain line $(DL)_{CR}$ is connected to the sense amplifier 20 via a transfer gate transistor $Tr_1$ that is supplied with a control signal RED for activating the redundant memory cell array and acts as the switch $SW_1$, while the drain line $(DL)_{UT}$ is connected to the sense amplifier 20 via a transfer gate transistor $Tr_2$ that is supplied with a control signal TEST for activating the testing in the utility memory cell array and acts as the switch $SW_2$. As usual in the column redundant memory circuits, the control signal RED is produced in response to the column address data upon the selection of a defective bit line. See for example the circuit of FIG. 5, wherein the signal RED is produced by the redundant decoder 24. On the other hand, the control signal TEST is produced externally upon the running of the test procedure.

In the present construction, the memory cell transistors are selected simultaneously in the redundant memory cell array $11_{CR}$ and the utility memory cell array $11_{UT}$, wherein the information signals thus read out from the selected memory cell transistors are selected further by the transistors $Tr_1$ and $Tr_2$ in response to the control signals RED and TEST supplied thereto.

Figure 25:
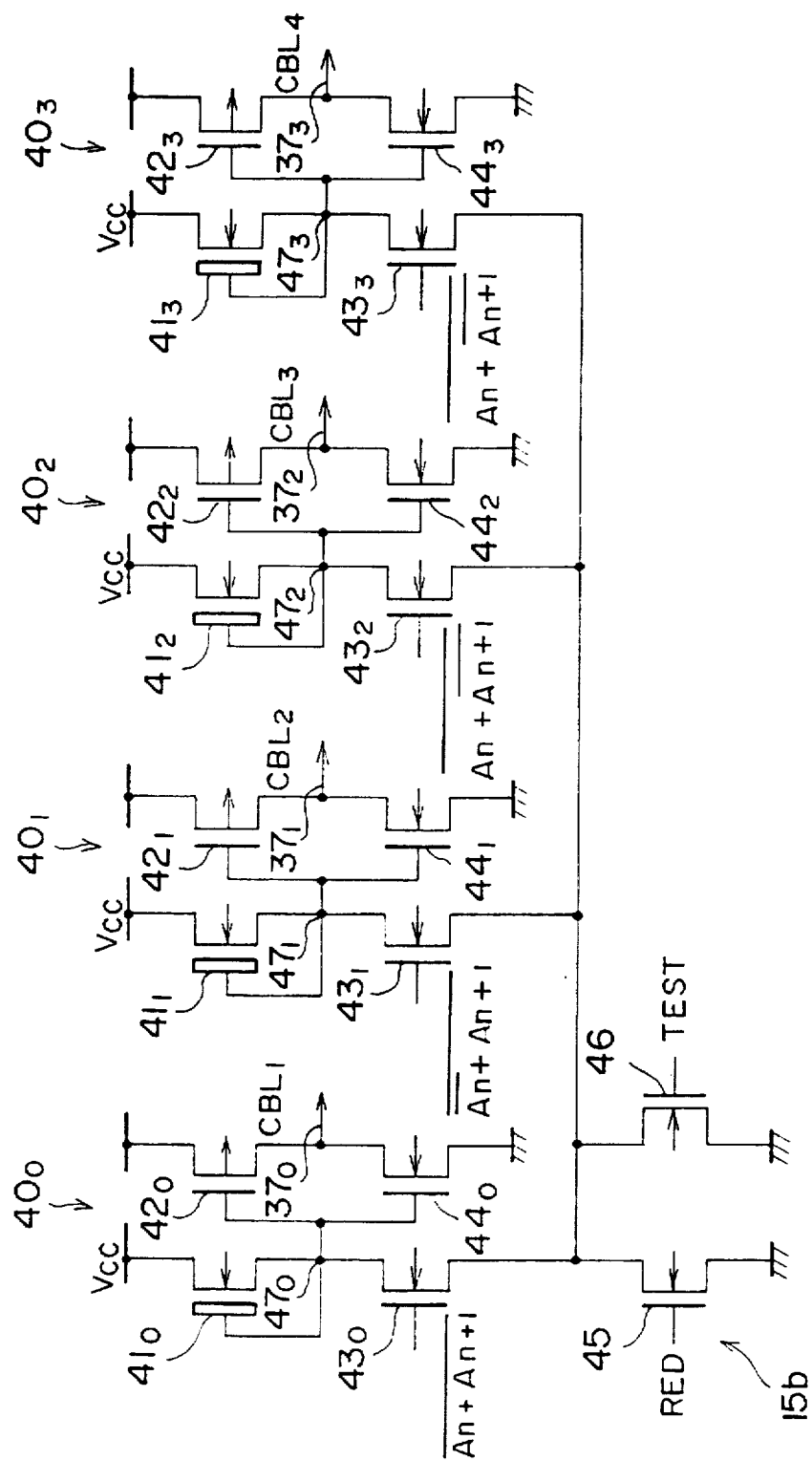
FIG. 25 is a circuit diagram showing an essential part of the memory device of FIG. 24.

In FIG. 24, it will be noted that the control signals RED and TEST are supplied also to the column driver 15a via an OR gate 15b for activating the same. FIG. 25 shows the construction of the OR gate 15b as a part of the driver circuit 15a.

Referring to FIG. 25, it will be noted that the driver circuit 15a includes a number of circuit blocks $40_0$–$40_3$ provided in correspondence to the column selection lines $BL_1$–$BL_4$, wherein each of the circuits blocks $40_0$–$40_3$ have the same construction and only the circuit block $40_0$ will be described.

The circuit block $40_0$ includes a depletion mode n-channel MOS transistor $41_0$ and an enhancement mode n-channel MOS transistor $43_0$ connected in series, wherein the drain of the transistor $41_0$ is connected to the supply voltage $V_{cc}$, while the source and drain of the transistor $41_0$ are connected to each other at a node $47_0$. Further, a selection signal $/(A_n+A_m)$ produced as a result of the decoding in the decoding part of the column decoder 15 is supplied to the gate of the transistor $43_0$, wherein the transistor $43_0$ has a source that is connected to the ground either via a transfer gate transistor 45 or the transfer gate transistor 46. There, it will be noted that the transistors 45 and 46 form a part of the OR gate circuit 15b. In response to the control signal RED or TEST, the transistor 45 or 46 is turned on and the transistor $43_0$ supplies an output signal to the foregoing node $47_0$ in response to the selection signal $/(A_n+A_{n+1})$ supplied to the gate of the transistor $43_0$, provided of course that the transistor 45 or 46 is turned on.

The output signal at the node $47_0$ is supplied further to the gate of the p-channel transistor $42_0$ and simultaneously to the gate of the n-channel transistor $44_0$ connected in series thereto, wherein the transistors $42_0$ and $44_0$ form an output stage circuit of the circuit block $40_0$ and connected between the supply voltage $V_{cc}$ and the ground. There, the output stage circuit outputs the column selection signal on the column selection line $BL_1$ that is connected to the intermediate node between the transistors $42_0$ and $44_0$.

It will be noted that each of the circuit blocks $40_1$–$40_3$ conducts the same operation in response to various combinations of the input signals such as $/(/A_n+A_{n+1})$, $/(A_n+/A_{n+1})$ and $/(/A_n+/A_{n+1})$, wherein the drain of the transistors $43_0$–$43_3$ are connected commonly to the transistors 45 and 46.

According to the present embodiment shown in FIG. 24, the area of the semiconductor chip that has been occupied by the column decoder can be reduced substantially, as the redundant memory cell array $11_{CR}$ and the utility memory cell array $11_{UT}$ use the same column decoder. Further, it should be noted that this feature is not only valid in the flash memory devices but also to other conventional semiconductor memories such as dynamic random access memories.

Next, a sixth embodiment of the present invention will be described with reference to FIG. 26 that corresponds to a modification of the construction of the circuit of FIG. 5.

Figure 26:
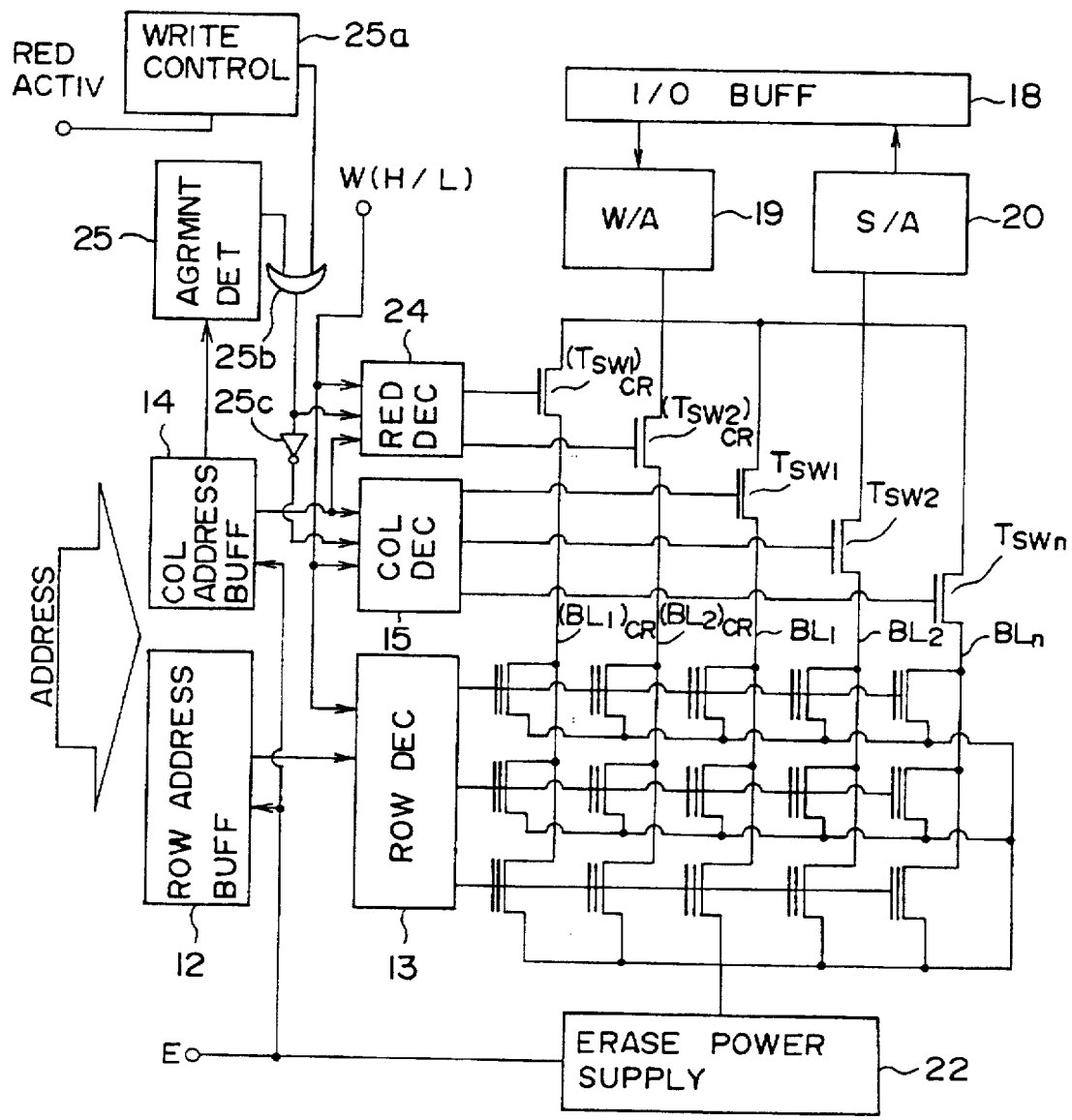
FIG. 26 is a block diagram showing the construction of the flash memory according to a sixth embodiment of the present invention.

Referring to FIG. 26, the circuit of the present embodiment is intended for testing the erasing operation of the flash memory device and includes a write control circuit 25a.

In the conventional column-redundant flash memory device of FIG. 5, it should be noted that the conventional circuit of FIG. 5 selects a redundant memory cell column when a defective memory cell column is addressed. Thereby, the writing of the defective memory cell column is not made and the memory cells included in the defective memory cell column become excessively erased state upon the flash-erasing process. In the circuit of FIG. 5, this excessive erasing of the defective column does not cause any problem, as the selection of such a defective column is prohibited by the column gate transistor such as $Tsw_3$.

When testing a newly fabricated device for identifying the defective memory cells with respect to the erasing performance, on the other hand, the foregoing construction has a drawback in that the writing of information into the redundant memory cell column is not possible in the absence of information about the defective memory cells. More specifically, the writing of data "0" into the memory cells before erasing for avoiding the excessive erasing cannot be conducted for the redundant memory cells. Thereby, the erasing test conducted upon the real memory cells connected to real bit lines $BL_1$–$BL_n$ inevitably causes an excessive erasing state in the redundant memory cells connected to the redundant bit lines $(BL_1)_{CR}$–$(BL_{21})_{CR}$.

In order to avoid the foregoing problem, the circuit of FIG. 26 employs a write control circuit 25a that activates the redundant column decoder 24 via an OR gate 25b in response to a redundant selection signal RED ACTIV. Simultaneously, the circuit 25a deactivates the column decoder 15 also via the OR gate as well as via an inverter 25b. Thus, when the signal RED ACTIV is high, the decoder 24 is activated and the writing of data is possible into the redundant memory cell columns, while when the signal RED ACTIV is set low, the decoder 24 is deactivated and the writing of data into the redundant memory cell columns is prohibited. In addition, it will be noted that the circuit of FIG. 26 achieves the usual column redundancy controlled by the defect detection circuit 25 via the OR gate 25b.

Thus, when conducting the foregoing erasing test, a control signal W is supplied to the decoders 13, 15 and 24 such that the signal W has a high level state corresponding to the voltage $V_{PP}$ for setting the memory cell transistors in the real memory cell array as well as in the redundant memory cell array to the state ready for writing information. Further, the control signal RED ACTIV is set to the low level state and the writing of the data "0" is achieved into the memory cell transistors in the real memory cell array while prohibiting the wiring of the data "0" into the redundant memory cell arrays. Next, the control signal RED ACTIV is set to the high level state and the writing of the data "0" is conducted into the redundant memory cell transistors while prohibiting the writing into the real memory cell transistors. Further, after the real memory cell transistors and the redundant memory cell transistors are all written with the data "0," the erase power supply 22 is activated in response to the erase control signal E, and the flash-erasing of information is achieved for the entirety of the memory cells including the real memory cells and the redundant memory cells.

Figure 27:
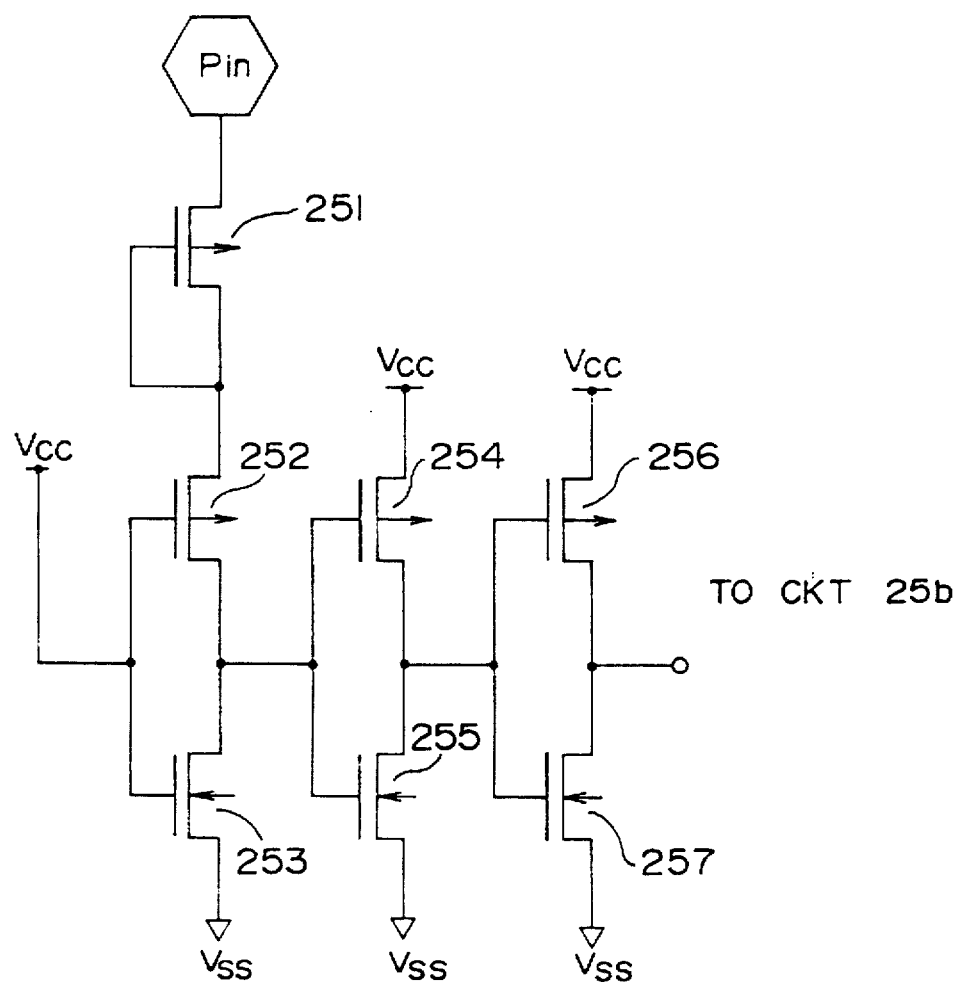
FIG. 27 is a circuit diagram showing a part of the memory device of FIG. 26.

FIG. 27 shows an example of the construction of the circuit 25a shown in FIG. 26, wherein the circuit includes p-channel MOS transistors 251 and 252 as well as an n-channel MOS transistor 253 connected in series with each other between the two supply voltages $V_{cc}$ and $V_{ss}$, wherein the transistors 252 and 253 have respective gates connected each other to the supply voltage $V_{cc}$. Thereby, the control signal RED ACTIV is supplied to a terminal $P_{in}$ connected to the drain of the transistor 251 and takes a voltage level $V_{HH}$ that exceeds the supply voltage $V_{CC}$ when the signal RED ACTIV is in the high level state. Thus, when the signal RED ACTIVE is high, the p-channel transistor 252 is turned on and the n-channel transistor 253 is turned on and a voltage at the node between the transistors 252 and 253 is supplied to an inverter circuit that includes a series connection of the p-channel transistor 254 and an n-channel transistor 255. Further, the output of the inverter is supplied to a next inverter that includes a series connection of a p-channel transistor 256 and an n-channel transistor 257, and the output control signal to be supplied to the OR gate 25b is obtained at the intermediate node between the transistors 256 and 257.

Figure 28:
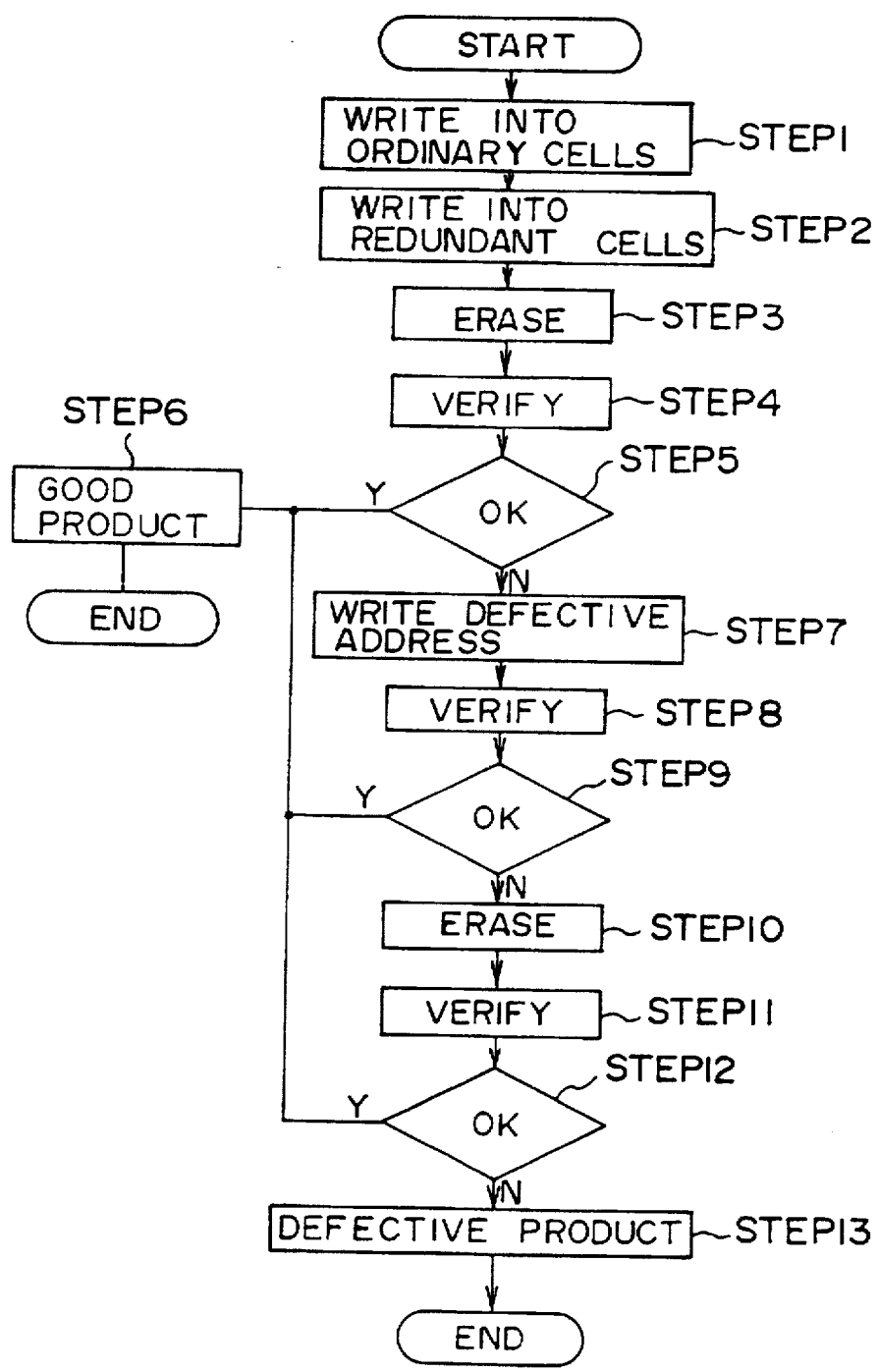
FIG. 28 is a flowchart for showing a test process for rejecting defective memory devices.

FIG. 28 shows a flowchart for separating defective produces from good products based upon the foregoing erasing test operation.

Referring to FIG. 28, the wring of data "0" is conducted into the real memory cells in a first step 1 by activating the column address buffer circuit 14 and the column decoder 15. Next, the writing of the data "0" is conducted into the redundant memory cells in a step 2 by activating the redundant decoder 24 via the write control circuit 25a.

After the memory cells in the real and redundant memory cell arrays are all written with the data "0", an erasing process is achieved in a step 3 by activating the erase power supply unit 22. Thereby, the flash erasing of information is achieved for the entirety of the memory cells in the real and redundant memory cell arrays.

Next, the result of the flash-erasing process of the step 3 is verified by reading the content of information of the memory cells in the real and redundant memory cell arrays. When it is discriminated in a step 5 that all the memory cells are subjected to the proper erasing process, the device is judged in a step 6 as being a good product.

On the other hand, when an erroneous erasing was found, the addresses of the defective memory cells that show the erroneous erasing are written into a memory that is provided in the defect detection circuit 25 in a step 7. Further, a verification process is conducted in a step 8 for verifying the column redundant operation of the device based upon the address of the defective memory cells.

When it is confirmed in a step 9 that the column redundant operation is satisfactory, the step 6 is conducted and the device is identified as being a good product. On the other hand, when the result of discrimination in the step 9 is unsatisfactory, a step 10 is conducted to achieve the erasing procedure again. Further, the operation of the device is verified in a step 11 by reading the content of the memory cells. Further, the result of the verification process of the step 11 is checked in a discrimination step 12 to discriminate whether the device achieves the satisfactory operation or not. If the result in the step 12 is YES, the step 6 is conducted and the device is identified to be a good product. On the other hand, when the result in the step 12 is NO, a step 13 is conducted wherein the device is identified as being a defective product.

Next, a seventh embodiment of the present invention will be described with reference to FIG. 29 that shows the principle of the embodiment.

Figure 29:
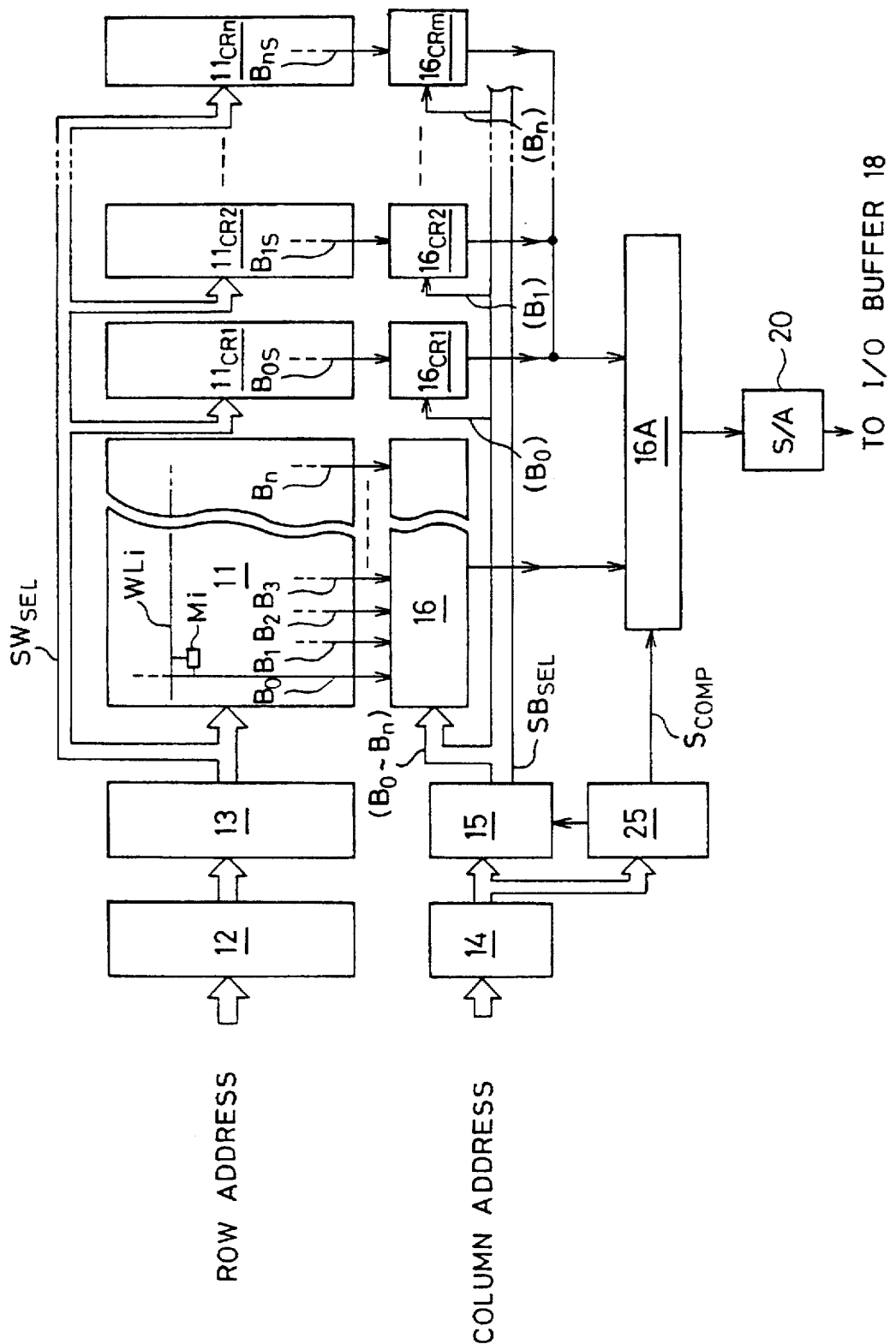
FIG. 29 is a block diagram showing the construction of the flash memory according to a seventh embodiment of the present invention.

Referring to FIG. 29, the present embodiment is based upon a concept similar to the concept of the embodiment of FIG. 23 and uses a common column decoder for the real memory cell array 11 and redundant memory cell arrays $11_{CR1}$–$11_{CRn}$. Thereby, the construction for realizing the column redundancy is substantially simplified. As the circuit of FIG. 29 is designed for the column redundancy instead of the embodiment of FIG. 23 that is designed for the testing of the redundant memory cell column and the utility memory cell column, there exists a difference between the circuit of FIG. 29 and the circuit of FIG. 23 as will be described below.

Referring to FIG. 29, it will be noted that the redundant decoder 24 used in the construction of FIG. 5 is no longer used in the present embodiment. Thereby, the column decoder 15 is used commonly for the real memory cell array 11 and the redundant memory cell arrays $11_{CR1}$–$11_{CRn}$, and the selection of a bit line such as $B_1$ in the memory cell array 11 causes a simultaneous selection of the bit lines in the redundant memory cell arrays. Thus, in order to transfer the information stored in a selected memory cell to the sense amplifier 20, there is provided a switch circuit 16A such the switch circuit 16A is activated in response to a control signal $S_{comp}$ outputted from the defect detection circuit 25.

Figure 30:
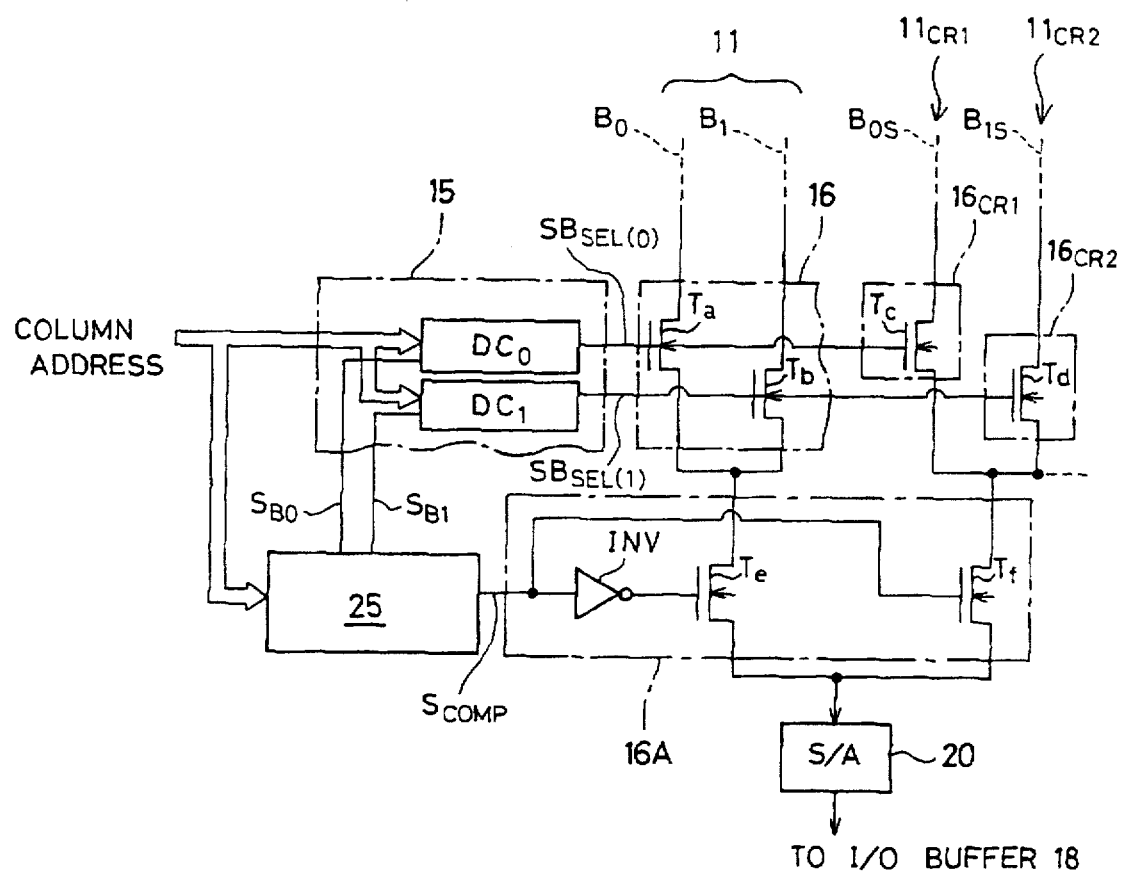
FIG. 30 is a circuit diagram showing an essential part of the memory device of FIG. 29.

FIG. 30 shows the essential part of the circuit of FIG. 29, wherein it will be noted that the column decoder 15 includes a number of decoding circuits $DC_0$, $DC_1$, . . . corresponding respectively to the column gate transistors $T_a$, $T_b$, $T_c$, $T_d$, . . . , wherein the decoding circuit $DC_0$ selects the bit line $B_0$ while the decoding circuit $DC_1$ selects the bit line $B_1$. There, the transistors $T_a$, $T_b$, . . . correspond to the previously described column gate transistors $Tsw_1$, . . . and form the 16, $16_{CR1}$, $16_{CR2}$, . . . . Further, the defect detection circuit 25 raises the level of one of the control signals $S_{B0}$, $S_{B1}$, . . . that are supplied therefrom to the decoding circuits $DC_0$, $DC_1$, . . . , selectively based upon the result of comparison of the supplied column address data with the address data of the defective memory cell columns. Thus, when an addressing of a defective memory occurs, a decoder such as $DC_1$ is selectively activated. In this case, the bit lines $B_1$ and $B_{1s}$ are selected simultaneously.

Simultaneously to the foregoing control of the column decoder 15, the defect detection circuit 25 supplies the control signal $S_{comp}$ to the switch circuit 16A. It will be noted that the switch circuit 16A includes transfer gate transistors $T_e$ and $T_f$ wherein the transistors $T_e$ and $T_f$ are turned on and turned off complementary in response to the control signal $S_{comp}$. It should be noted that the transistor $T_e$ is provided in correspondence to the real memory cell array 11 and the bit lines $B_0$, $B_1$, . . . in the real memory cell array 11 are connected commonly to the transistor $T_e$ via respective column gate transistors $T_a$, $T_b$, . . . . Similarly, the redundant bit lines $B_{0S}$, $B_{1S}$ of the redundant memory cell arrays are connected commonly to the transistor $T_f$ that corresponds to the redundant memory cell array.

Figure 31:
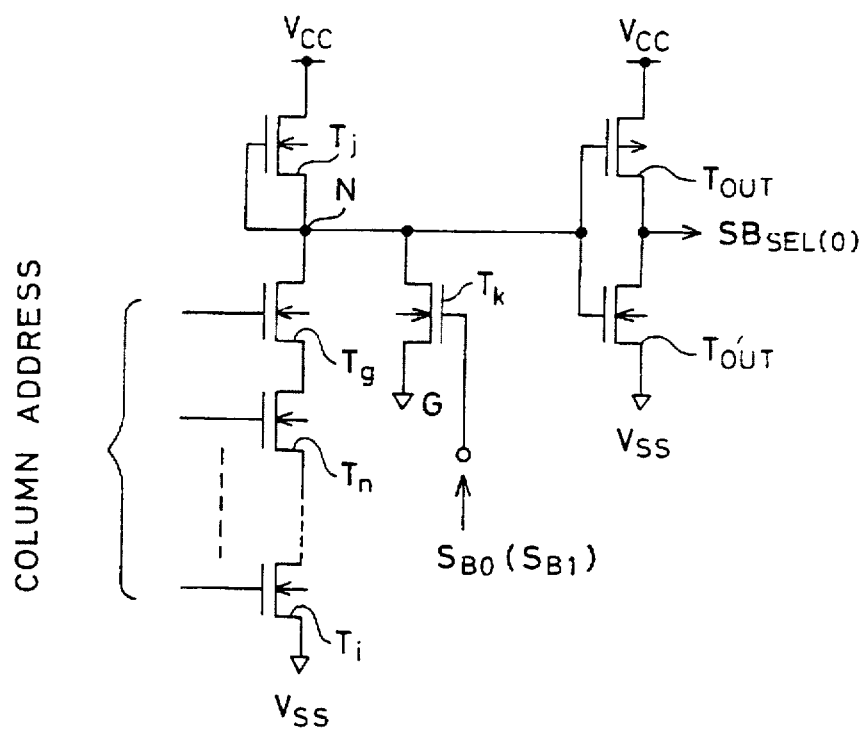
FIG. 31 is a circuit diagram showing a part of the memory device of FIG. 29.

FIG. 31 shows the construction of the decoding circuit such as $DC_0$, wherein it will be noted that p-channel transistors $T_j$, $T_g$, $T_n$, . . . , $T_i$ are connected in series between the supply voltage $V_{CC}$ and the supply voltage $V_{SS}$, wherein the transistors $T_g$, $T_n$, . . . $T_i$ are supplied with a logic combination of the column address signals and cause a transition to the turned-on state in correspondence to a particular logic combination thereof, while the transistor $T_j$ acts as a constant current source and supplies a drive current to a node N where the transistor $T_j$ and the transistor $T_g$ are connected with each other. There, the output obtained at the node N as a result of the foregoing decoding action of the transistors $T_g$–$T_i$ is supplied to an output inverter that includes a series connection of a p-channel MOS transistor $T_{OUT}$ and an n-channel MOS transistor $T_{OUT}'$ as usual, wherein there is provided an additional transistor $T_k$ such that the transistor $T_k$ is connected between the node N and the ground G. There, the transistor $T_k$ is supplied with the foregoing signal $S_{B0}$ or $S_{B1}$ from the defect detection circuit 25 at the gate thereof and urges the level of the node N at the low level state in response to the high level state of the control signal $S_{B0}$ or $S_{B1}$, irrespective of the logic combination of the column address signal. Thereby, the output level of the output inverter is forced to the high level state. In other words, the control signals $S_{B0}$ and $S_{B1}$ from the defect detection circuit 25 overrides the result of the decoding in the column decoder, and the selection of the redundant bit line occurs irrespective of the decoding operation in the column decoder 15, as long as the column address data specifies a defective memory cell column.

FIG. 32 shows a modification of the embodiment of FIG. 29, wherein the real memory cell array 11 is divided into a plurality of memory cell blocks $11_1$ and $11_2$. In correspondence to this, redundant memory cell blocks $11_{CR1}$ and $11_{CR2}$ are provided. There, the bit lines in the memory cell block $11_1$ are selected by a column gate switch circuit $16_1$, the bit lines in the memory cell block $11_2$ are selected by a column gate switch circuit $16_2$, while the bit lines in the memory cell block $11_{CR1}$ are selected by a column gate switch circuit $16_{CR1}$, and the bit lines in the memory cell block $11_{CR2}$ are selected by a column gate switch circuit $16_{CR2}$.

In this construction, a redundant decoder 24A similar to the redundant decoder 24 of FIG. 5 is used for activating the column gate switches $16_1$, $16_2$, $16_{CR1}$ and $16_{CR2}$, wherein the column gate switches $16_1$ and $16_2$ are controlled by the column decoder as usual. On the other hand, the column gate switches $16_{CR1}$ and $16_{CR2}$ are activated commonly by a control signal $SR_{SEL}$ produced by a redundant decoder 24A. There, the redundant decoder 24A is supplied with the column address data from the column buffer 14 simultaneously to the column decoder 15 and controls the decoder 15 by supplying a control signal $S_{INH}$ such that the operation of the decoder 15 is prohibited when there exist a bit line in the real memory cell $11_1$ or $11_2$ and also a bit line in the redundant memory cell $11_{CR1}$ and $11_{CR2}$ in correspondence to a given column address. For example, when a defective column line is selected, the decoder 24A prohibits the operation of the decoder 15 and selects redundant bit lines in the memory cell arrays $11_{CR1}$ and $11_{CR2}$. Thereby, the reading of information is achieved either from the real memory cell array or from the redundant memory cell array. For example, the reading is achieved either from the memory cell array $11_1$ or $11_{CR1}$, and the information thus read out is supplied to the transistor $T_e$ that forms a part of the switch circuit 16A. Alternatively, the reading of information is achieved either from the memory cell array $11_2$ or from the redundant memory cell array $11_{CR2}$ and the information thus read out is supplied to the transistor $T_f$ included in the switch circuit 16A.

There, the decoder 24A further produces control signals $SR_1$ and $SR_2$ and activates either the transistor $T_e$ or the transistor $T_f$ in response to the logic combinations of the signals $SR_1$ and $SR_2$ via a control circuit 24B. As a result, reading of information is achieved selectively from either of the memory cell arrays $11_1$, $11_2$, $11_{CR1}$ and $11_{CR2}$.

Figure 33:
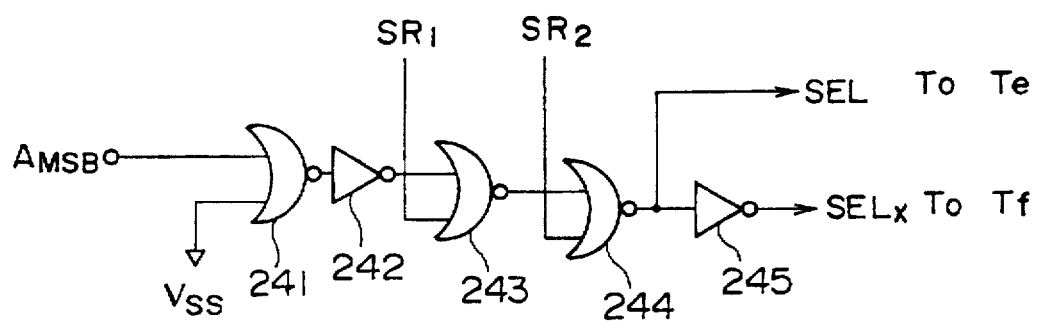
FIG. 33 is a circuit diagram showing a part of the flash memory of FIG. 32.

FIG. 33 shows the construction of the circuit 24B.

Referring to FIG. 33, the circuit 24B includes a NOR gate 241 and a NAND gate 242 connected in series wherein the supply voltage $V_{SS}$ is supplied to one input terminal of the NOR gate 241 while the most significant bit $A_{MSB}$ of the column address data is supplied to the other input terminal. The output of the NAND gate 242 is supplied to a NOR gate 243, wherein the NOR gate 243 is supplied with the control signal $SR_1$ at the other input terminal. Further, the output of the NOR gate 243 is supplied to a first input terminal of a NOR gate 244 that is supplied also with the control signal $SR_2$ at the other input terminal. Further, the output of the NOR gate 244 is supplied to the transistor $T_e$ as a control signal SEL and further to the transistor $T_f$ via an inverter 245 as a control signal SELx. There, it will be noted that the output signals SEL and SELx are produced as a result of the logic combination of the signals $A_{MSB}$, $SR_1$ and $SR_2$. There, the signal SEL takes the same logic level as the signal $A_{MSB}$ when the signals $SR_1$ and $SR_2$ both have the low level state in correspondence to the non-redundant operation. On the other hand, the logic level of the output signal SEL is urged to the high level state when the signal $SR_1$ has the high level state. Further, the signal SEL is urged to the low level state when the signal $SR_2$ has the high level state.

The present modification as described with reference to FIGS. 32 and 33 is also effective for simplifying the construction of the memory device by controlling the redundant memory cell arrays $11_{CR1}$ and $11_{CR2}$ by the same control signal $SR_{SEL}$ produced by the same decoder circuit 24A.

Next, an eighth embodiment of the present invention will be described with reference to FIG. 34.

In the flash memory devices, attempts are made to reduce the voltage that is applied to the source region of the memory cell transistor. In the conventional erasing process explained with reference to FIG. 2, it will be noted that a very high voltage ($V_H$) such as 12 volts has to be applied to the drain region of the memory cell transistor. On the other hand, the application of such a high voltage to the n$^+$-type source region tends to invite a breakdown at the p-n junction between the source region and the substrate. Further, the application of such a very large voltage to the source region tends to induce a depletion region in the substrate immediately under the gate insulation film, and the large electric field associated with such a depletion region may cause to flow a tunneling current from the valence band to the conduction band. Thereby, an unnecessarily large current flows in the form of the source current when erasing information. In addition, such a large electric field tends to cause an injection of holes into the gate insulation film, and the injection of holes deteriorates the operational characteristics and the lifetime of the flash memory device.

The erasing process explained already with reference to FIGS. 11 and 12 for the second embodiment avoids this problem by applying a large negative voltage to the control gate electrode such that the necessity of applying a high voltage to the source region is eliminated.

In the present embodiment, the same goal as the second embodiment is achieved by applying simultaneously a positive voltage to the substrate and a negative voltage to the control gate electrode, when erasing information, with the same magnitude such that no extraordinary large voltage appears between the active parts of the memory cell transistors as well as the peripheral transistors forming the peripheral circuit.

FIG. 34 shows the foregoing principle of the present embodiment as well as the device structure of the present embodiment that is tailored for implementing the foregoing principle.

Referring to FIG. 34, the flash memory is constructed on a p-type substrate 110 that is defined with a memory cell region wherein memory transistors A and B are formed and a peripheral region wherein a peripheral transistor is formed. There, the memory cell region includes $n^+$-type diffusion regions 126a and 128a respectively serving for the source and drain of the memory cell transistor A and diffusion regions 126b and 128b respectively serving for the source and drain of the memory cell transistor B. Further, the memory cell transistors A and B are isolated from each other by a field oxide region 116, and a gate insulation film 118 covers the surface of the device region for the transistors A and B as usual in MOS transistors.

On the gate insulation film 118, a floating gate electrode 120a is provided in correspondence to the memory cell transistor A, while a floating gate electrode 120b is provided on the gate insulation film 118 in correspondence to the memory cell transistor B. On the floating gate electrodes 120a and 120b, capacitor insulation films 122a and 122b are formed respectively, and control gate electrodes 124a and 124b are provided respectively on the capacitor insulation films 122a and 122b.

Further, it will be noted that a p-type well 114 surrounded by an external well 112 is formed in the substrate 110 in correspondence to the peripheral region, and $n^+$-type diffusion regions 132 and 134 are formed in the well 114 as the source and drain of the peripheral transistor. As usual, the gate insulation film 118 is formed also on the surface of the substrate 110 in correspondence to the peripheral transistor and a gate electrode 130 is provided thereon.

When erasing information from the memory cell transistor A, for example, the present embodiment applies a gate voltage of −10 volts to the control gate electrode 124a while simultaneously applies a substrate voltage of +10 volts. Thereby, a voltage difference of 20 volts is formed between the control gate electrode 124a and the substrate 110, and the electrons accumulated in the floating gate 120a are expelled to the substrate 110 in the form of the Fowler-Nordheim tunnel current. In order to avoid the unwanted erasing of information, a positive voltage of +10 volts is applied simultaneously to the control gate 124b of the memory cell transistor. Thereby, it will be noted that the voltage difference between the control gate 124b and the substrate 110 becomes zero.

When implementing the foregoing principle for erasing information, it will noted that the voltage level of the substrate 110 increases positively also in the peripheral region if the substrate of the peripheral region is not isolated from the rest of the part of the substrate in the form of double well structure shown in FIG. 34. There, the positive voltage level applied to the p-type substrate inevitably induces a forward biasing at the p-n junction between the substrate and the diffusion regions 132, 134.

The present embodiment avoids this problem of adversary forward biasing by providing an n-type well 112 in the substrate 110 in correspondence to the peripheral region and further by forming a p-type well 114 within the n-type well 112. Thereby, the diffusion regions 132 and 134 are formed within the p-type well 114.

In operation, a positive voltage set equal to the positive voltage applied to the substrate 112 is applied to the n-type well 112 such that there occurs no substantial biasing between the p-type substrate 110 and the n-type well. Further, the voltage level of the p-type well 114 is held at zero volt. Thereby, the p-n junction at the interface between the n-type well 112 and the p-type well 114 are reversely biased, and the depletion region developing along the p-n junction effectively isolates the p-type well 114 from the p-type substrate 110. Thus, the structure of FIG. 34 enables the effective erasing of information without providing excessive electric stress to any part of the device.

In the structure of FIG. 34, the reading and writing of information is achieved similarly to the conventional process shown in FIG. 2. Further, when erasing information, one may apply the same positive voltage as the substrate voltage to the source and drain regions of the memory cell transistor.

FIG. 35 is a modification of the device of FIG. 34, wherein the memory cell region is isolated from the peripheral region by a double well isolation structure. There, it will be noted that the double well includes an outer n-type well 136 and an inner p-type well 138, and the diffusion regions of the memory cell transistors A and B are all formed within the inner p-type well 138. As the rest of the feature is identical with the embodiment of FIG. 34, further description of the structure of FIG. 35 will be omitted.

Next, the fabrication process of the deice of FIG. 34 will be described with reference to FIGS. 36(A)–36(F).

Figure 36A:
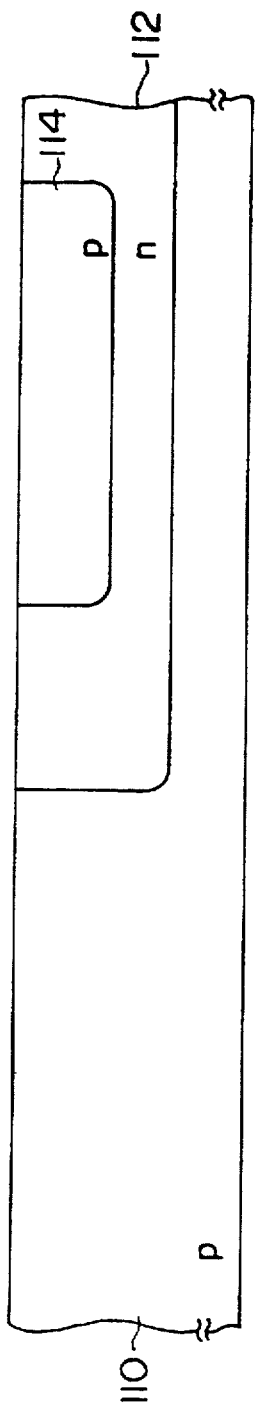

Referring to FIG. 36(A), the n-type well 112 is formed in the substrate 110 in correspondence to the peripheral region by means of an ion implantation process of an n-type dopant such as As or P followed by a thermal annealing process. Next, the p-type well 114 is formed in the n-type well 112 by means of an ion implantation process of a p-type dopant such as B.

Figure 36B:
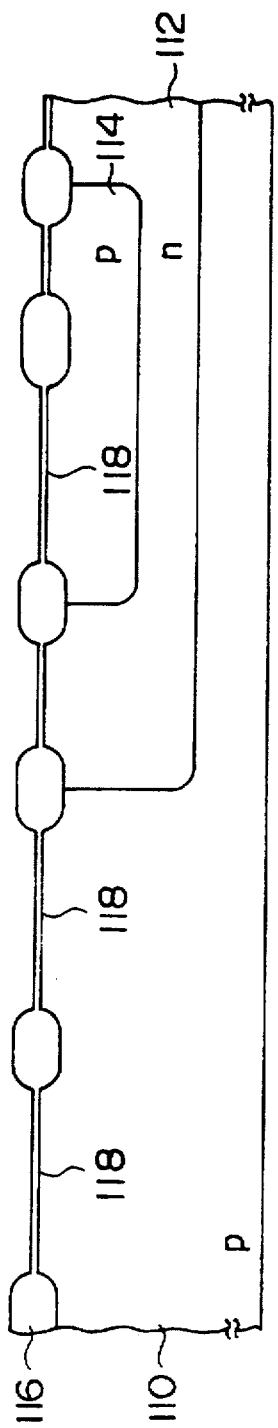

Next, the surface of the substrate 110 is protected by an oxidation resistant mask (not shown) such as silicon nitride in correspondence to the region where the active part of the device is formed, and the substrate 110 thus masked is subjected to a thermal oxidation process conducted in a wet $O_2$ environment. Thereby, the field oxide region 16 is formed. Next, the mask is removed and the gate oxide film 118 is formed by a thermal oxidation process conducted in a dry $O_2$ environment. Thereby, the structure shown in FIG. 36(B) is formed.

Next, a first polysilicon layer is deposited and patterned subsequently to form the floating gate electrodes 120a and 120b respectively in correspondence to the memory cell transistors A and B as shown in FIG. 36(C). Further, the structure of FIG. 36(C) is subjected to a thermal oxidation process to form the capacitor insulation films 122a and 122b on the floating electrodes 120a and 120b, respectively, and a second polysilicon layer 124 is deposited further thereon. Thereby, the structure shown in FIG. 36(D) is obtained.

Next, in the step of FIG. 36(E), the polysilicon layer 124 is patterned to form the control gate electrodes 124a and 124b as well as the gate electrode 130. Further, in the step of FIG. 36(F), ion implantation of the n-type dopant such as As or P is conducted to form the diffusion regions 126a, 126b, 128a and 128b while using the gate structure as a self-alignment mask in each of the memory cell region and the peripheral region.

In any of the foregoing embodiments, one may employ a laminated structure of silicon nitride sandwiched by a pair of silicon oxide films for the capacitor insulation film 4 shown in the memory cell transistor of FIG. 1. By employing such a laminated structure, it is possible to reduce the thickness of the capacitor insulation film without sacrificing the reliability and anti-leak characteristics of the device. Thereby, an efficient capacitor coupling is achieved between the control electrode and the floating gate electrode. It should be noted that the silicon oxide film formed on the polysilicon floating gate shown in FIG. 1 tends to form pinholes when the thickness is reduced due to the effect of the grain boundaries in the gate electrode. By covering the thin silicon oxide film by a silicon nitride film and form a thin silicon oxide film further on the silicon nitride film, one can successfully eliminate the leak from the floating gate while reducing the thickness of the capacitor insulation film.

Figure 37:
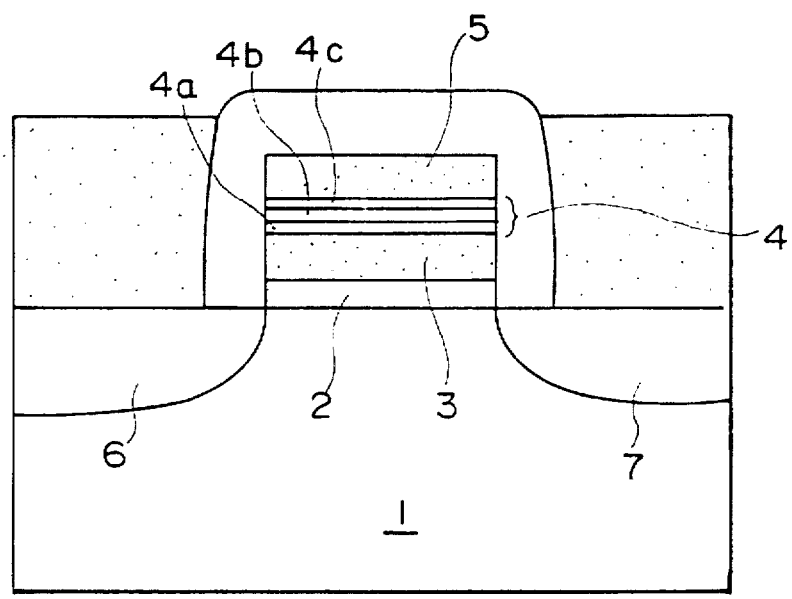
FIG. 37 is a diagram showing the structure of a memory cell transistor used in the present invention.

FIG. 37 shows the structure of such a memory cell transistor that has the laminated structure for the capacitor insulation film 4. In FIG. 37, those parts correspond to the parts shown in FIG. 1 are represented by the same reference numerals. There, it will be noted that the capacitor insulation film 4 includes a silicon oxide film 4a formed directly on the floating gate electrode 3, a silicon nitride film 4b deposited on the silicon oxide film 4a, and a silicon oxide film 4c formed on the silicon nitride film 4b.

In the embodiments described heretofore, it should be noted that the power supply unit 22 as well as the power supply units $22_1, \ldots$ may be a switching circuit for switching the source voltage between a high level voltage such as +12 volts and a low level voltage such as +5 volts, instead of the voltage generator circuit that generates the high voltage output and the low voltage output. In such a construction, two voltage sources, the first for providing the high voltage and the second for providing the low voltage are used, and the power supply unit merely switches the output voltage in response to a control signal.

Further, the present invention is not limited to the embodiments described heretofore, but various variations and modifications may be made without departing from the scope of the invention.

What is claimed is:

1. A method for writing information into a flash-erasable semiconductor memory device, said flash-erasable semiconductor memory device comprising: a memory cell array that includes a plurality of memory cell transistors, each of said memory cell transistors comprising: an insulated floating gate provided on a semiconductor substrate with a separation therefrom for storing information in the form of electric charges; a gate insulation film provided on an upper major surface of said semiconductor substrate for separating said floating gate from said semiconductor substrate; a channel region defined in said semiconductor substrate in correspondence to said floating gate electrode; a source region and a drain region defined in said semiconductor substrate at both sides of said floating gate, said source region injecting carriers into said channel region such that said carriers are transported along said channel region while said drain region collecting carriers that have been injected into said channel region at said source region and transported through said channel region; and a control electrode provided on said floating gate with a separation therefrom by said capacitor insulation film for controlling an injection of carriers from said channel region to said floating gate via said gate insulation film; said method comprising the steps of:

selecting a memory cell transistor to which a writing of information is to be achieved;

increasing a level of a gate voltage that is supplied to said control electrode of said selected memory cell transistor to a predetermined level used for writing information;

increasing a level of a drain voltage that is supplied to said drain region to a predetermined level used for writing information, said step of increasing the level of the drain voltage being achieved after said step for increasing the level of the gate voltage has been achieved;

decreasing the level of said drain voltage after said step of increasing the level of said drain voltage; and decreasing the level of said gate voltage after said step of decreasing the level of said drain voltage.

2. A method as claimed in claim 1, wherein said step of increasing the level of said drain voltage is delayed with respect to said step of increasing the level of said gate voltage by a delay time larger than a signal delay occurring in a conductor strip connected to said control electrode.

3. A method as claimed in claim 1, wherein said step of decreasing the level of said gate voltage is delayed with respect to said step of decreasing the level of said drain voltage by a delay time larger than a signal delay occurring in a conductor strip connected to said control electrode.

* * * * *

UNITED STATES PATENT AND TRADEMARK OFFICE
CERTIFICATE OF CORRECTION

PATENT NO. : 5,835,416

DATED : November 10, 1998

INVENTOR(S) : Akaogi et al.

It is certified that error appears in the above-identified patent and that said Letters Patent is hereby corrected as shown below:

```
On the title page, item:
Item [56], please insert references as follows:

-- 5,122,985   6/1992   Santin .............. 365/185.18
   5,140,182   8/1992   Ichimura ............ 365/185.18
   5,283,758   2/1994   Nakayama et al ...... 365/185.18 --
```

Signed and Sealed this

Sixth Day of July, 1999

Attest:

Q. TODD DICKINSON

*Attesting Officer*      Acting Commissioner of Patents and Trademarks